(12) United States Patent
Sahoda et al.

(10) Patent No.: US 8,387,556 B2
(45) Date of Patent: Mar. 5, 2013

(54) SUBSTRATE PROCESSING SYSTEM

(75) Inventors: Tsutomu Sahoda, Kawasaki (JP);
Futoshi Shimai, Kawasaki (JP);
Akihiko Sato, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 209 days.

(21) Appl. No.: 12/824,025

(22) Filed: Jun. 25, 2010

(65) Prior Publication Data

US 2011/0000428 A1 Jan. 6, 2011

(30) Foreign Application Priority Data

Jul. 6, 2009 (JP) .................. 2009-160042
Jun. 21, 2010 (JP) ................ P2010-140954

(51) Int. Cl.
*B05C 11/02* (2006.01)
*B05C 5/00* (2006.01)
*B05B 7/06* (2006.01)

(52) U.S. Cl. .......... 118/320; 118/52; 118/612; 118/313; 118/315; 118/500; 134/153; 134/902

(58) Field of Classification Search ............... 118/52, 118/56, 612, 319, 320, 313–315, 500; 396/604, 396/611, 627; 427/240; 134/153, 198, 902
See application file for complete search history.

(56) References Cited

U.S. PATENT DOCUMENTS 6,082,377 A * 7/2000 Frey .................. 134/6
2007/0111542 A1* 5/2007 Shinozaki et al. ........... 438/780
2008/0142051 A1* 6/2008 Hashizume .................. 134/23

FOREIGN PATENT DOCUMENTS
JP H07-130642 5/1995

* cited by examiner

*Primary Examiner* — Yewebdar Tadesse
(74) *Attorney, Agent, or Firm* — Knobbe Martens Olson & Bear LLP

(57) ABSTRACT

A coating device includes a coating mechanism which includes nozzles for ejecting a liquid material onto front and rear surfaces of the substrate while rotating a substrate in an upright state at a predetermined coating position, a carrying mechanism which carries the substrate between a substrate loading position, the coating position, and a substrate unloading position, and a dummy substrate holding mechanism which holds a dummy substrate at a holding position which is a position different from the substrate loading position, the coating position, and the substrate unloading position, and at which the carrying mechanism is allowed to connect with the dummy substrate.

10 Claims, 15 Drawing Sheets

SUBSTRATE PROCESSING SYSTEM

BACKGROUND OF THE INVENTION

1. Field of the Invention

The present invention relates to a substrate processing system.

Priority claimed on Japanese Patent Application No. 2009-160042, filed on Jul. 6, 2009, and Japanese Patent Application No. 2010-140954, filed on Jun. 21, 2010, the contents of which are incorporated herein by reference.

2. Description of the Related Art

For example, in a substrate processing system coating a thin film such as a resist film on various substrates such as a semiconductor substrate, a glass substrate forming a liquid crystal panel, and a substrate forming a hard disk, a coating device is used to form the coating film on the substrate while the substrate is rotated. In the coating device, in general, the substrate is laid down so as to be parallel to a horizontal plane and the substrate is rotated while the lower substrate surface is held.

Meanwhile, in the substrate used to form the hard disk, for example, it is necessary to coat the liquid material on both surfaces thereof. In the case of this kind of substrate in which both surfaces are required to be coated with the liquid material, it is not possible to hold the lower substrate surface. For this reason, Patent Reference 1, for example, discloses a technology in which the substrate is rotated while the substrate is held by a holding piece.

In the case where the liquid material is coated on both surfaces of the substrate when the substrate is laid down, the coating conditions between the top and bottom surfaces of the substrate are different. For this reason, the state of the thin film formed on the top surface of the substrate may be different from the state of the thin film formed on the bottom surface thereof. To the contrary, there has recently been proposed a technology in which the liquid material is simultaneously coated on both surfaces of the substrate in an upright (i.e. vertical) state.

In the case where the liquid material is coated on both surfaces of the substrate in an upright state, for example, a technique that a substrate is accommodated in an upright cup, and a liquid material is ejected from nozzles while rotating the substrate may be used. In this case, droplets of the liquid material are adhered to the inside of the cup, and the droplets may be adhered to the substrate as well. For this reason, it is necessary to appropriately clean the inside of the cup.

As a technique of cleaning the inside of the cup, for example, a technique that a dummy substrate of a size nearly equal to a substrate is disposed at a coating position for the substrate, and a cleaning liquid is ejected onto the dummy substrate by nozzles for cleaning may be used. In this case, droplets of the cleaning liquid ejected onto the dummy substrate are splashed inside the cup, and the cleaning liquid is supplied to the inside of the cup, which makes it possible to clean the inside of the cup with the cleaning liquid.

[Patent Reference 1]

Japanese Unexamined Patent Application, First Publication No. Hei 7-130642

BRIEF SUMMARY OF THE INVENTION

Meanwhile, in the case where the inside of the cup is cleaned by using a dummy substrate, it is necessary to perform a cleaning process after once stopping a coating process of the liquid material onto the substrate to dispose the dummy substrate at the coating position. Accordingly, it is extremely inefficient, which results in a lowering of throughput.

In consideration of the above-described circumstance, an object of the invention is to provide a substrate processing system, which is capable of efficiently disposing a dummy substrate at a coating position while suppressing a lowering of throughput.

In order to achieve the above-described object, there is provided a substrate processing system including a coating mechanism which includes nozzles for ejecting a liquid material onto front and rear surfaces of the substrate while rotating the substrate in an upright state at a predetermined coating position, a carrying mechanism which carries the substrate between a substrate loading position, the coating position, and a substrate unloading position, and a dummy substrate holding mechanism which holds a dummy substrate at a holding position which is a position different from the substrate loading position, the coating position, and the substrate unloading position, and at which the carrying mechanism is allowed to connect with the dummy substrate.

According to the present invention, since the substrate processing system is provided with the dummy substrate holding mechanism which holds a dummy substrate at a holding position which is a position different from the substrate loading position, the coating position, and the substrate unloading position, and at which the carrying mechanism is allowed to connect with the dummy substrate, it is possible to carry the dummy substrate to the coating position by using the carrying mechanism. Accordingly, it is possible to efficiently dispose the dummy substrate at the coating position while suppressing a lowering of throughput.

In the above-described substrate processing system, it is preferable that the holding position is disposed at an altitudinal position which is the same as at least one of the substrate loading position, the coating position, and the substrate unloading position.

In this case, since the holding position is disposed at the altitudinal position which is the same as at least one of the substrate loading position, the coating position, and the substrate unloading position, the control of an altitudinal position of the carrying mechanism can be set in common with at least one of the substrate loading position, the coating position, and the substrate unloading position. Accordingly, it is possible to avoid the complexity of the operation of the carrying mechanism.

In the above-described substrate processing system, it is preferable that a plurality of the holding positions are set.

In this case, since the plurality of holding positions are set, it is possible to carry a dummy substrate held at an optimum holding position among the plurality of holding positions according to a position of the carrying mechanism and a coating situation. Accordingly, it is possible to improve the efficiency of the process.

In the above-described substrate processing system, it is preferable that dummy substrates respectively different in size are held at the plurality of holding positions.

In this case, since the dummy substrates respectively different in size are held at the plurality of holding positions, it is possible to select a dummy substrate of an optimum size to carry the dummy substrate to the coating position.

In the above-described substrate processing system, it is preferable that the dummy substrate holding mechanism includes a managing portion which manages a state of the dummy substrate.

In this case, since the dummy substrate holding mechanism includes a managing portion which manages a state of the dummy substrate, it is possible to maintain a state of a dummy substrate in an optimum state.

In the above-described substrate processing system, it is preferable that the holding position is disposed at a position so as to interpose the carrying mechanism with the substrate loading position or the substrate unloading position.

In this case, since the holding position is disposed at a position so as to interpose the carrying mechanism with the substrate loading position or the substrate unloading position, the holding position is disposed at a position easily accessed by the carrying mechanism. Accordingly, it is possible to more rapidly carry the dummy substrate to the coating position.

In the above-described substrate processing system, it is preferable that the dummy substrate holding mechanism includes a dummy substrate raising and lowering mechanism which raises and lowers the dummy substrate.

In this case, since the dummy substrate holding mechanism includes the dummy substrate raising and lowering mechanism which raises and lowers the dummy substrate, it is possible to easily carry out replacement and installation of the dummy substrate. Accordingly, it is possible to perform setting of the dummy substrate more rapidly by a simple operation.

It is preferable that the above-described substrate processing system further includes a cleaning mechanism which cleans the coating mechanism by using the dummy substrate.

In this case, since the above-described substrate processing system further includes the cleaning mechanism which cleans the coating mechanism by using the dummy substrate, it is possible to efficiently clean the coating mechanism.

In the above-described substrate processing system, it is preferable that the cleaning mechanism includes cleaning nozzles for ejecting a cleaning liquid onto the dummy substrate.

In this case, since the cleaning mechanism includes the cleaning nozzles for ejecting a cleaning liquid onto the dummy substrate, it is possible to supply the cleaning liquid to the coating mechanism in the same environment as a case where the liquid material is ejected onto the substrate. Accordingly, it is possible to improve the cleaning efficiency.

In the above-described substrate processing system, it is preferable that the coating mechanism includes a cup portion in which the substrate is accommodated, and the cleaning mechanism cleans the cup portion.

In this case, since the coating mechanism includes the cup portion in which the substrate is accommodated, and the cleaning mechanism cleans the cup portion, in the case where the cup portion is used, it is possible to more efficiently clean the inside of the cup portion.

According to the present invention, it is possible to efficiently dispose a dummy substrate at a coating position while suppressing lowering of throughput.

DETAILED DESCRIPTION OF THE INVENTION

The embodiment of the invention will be described with reference to the accompanying drawings.

Figure 1:
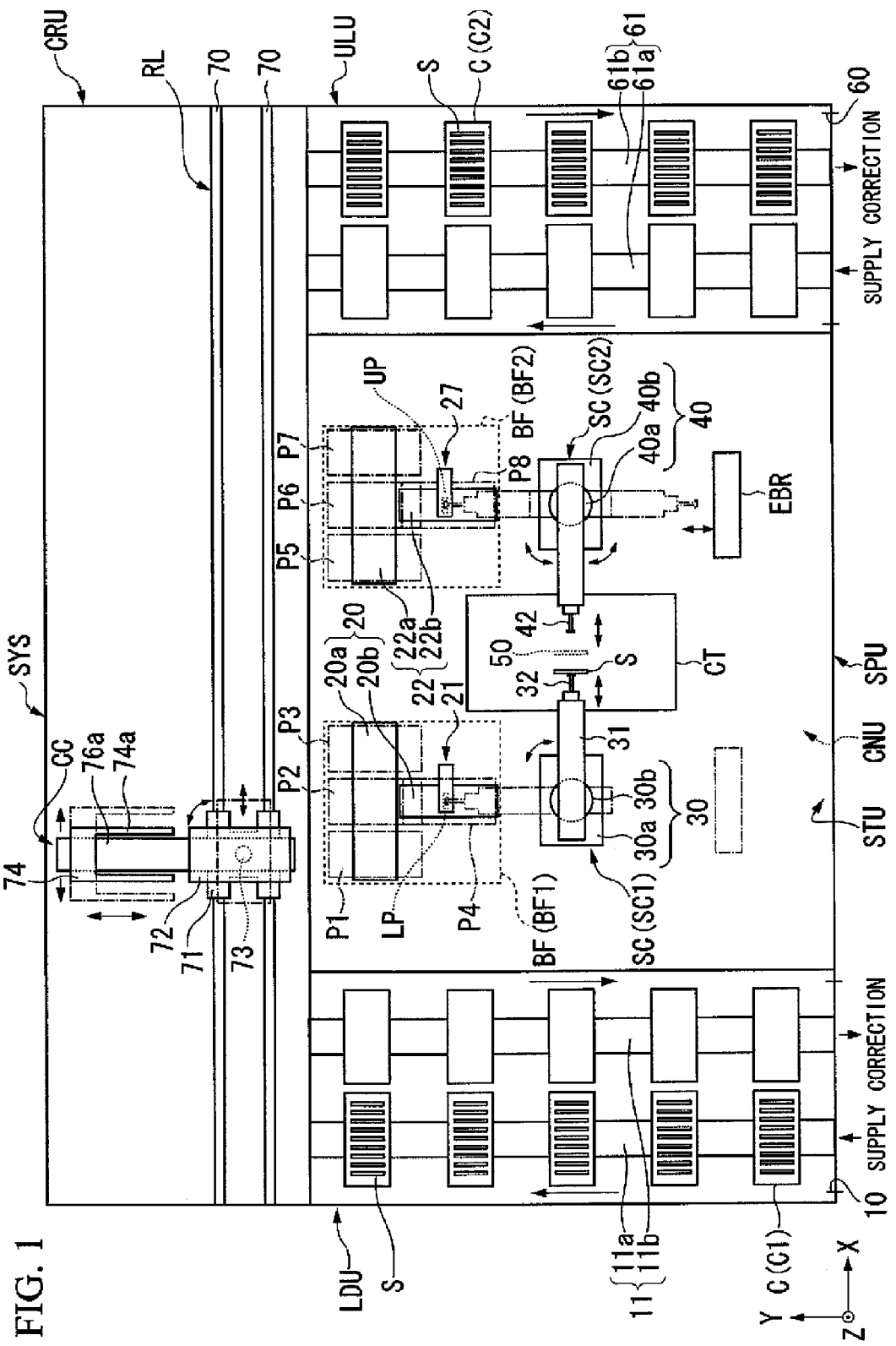
FIG. 1 is a plan view showing a constitution of a substrate processing system according to the embodiment of the invention.
Figure 2:
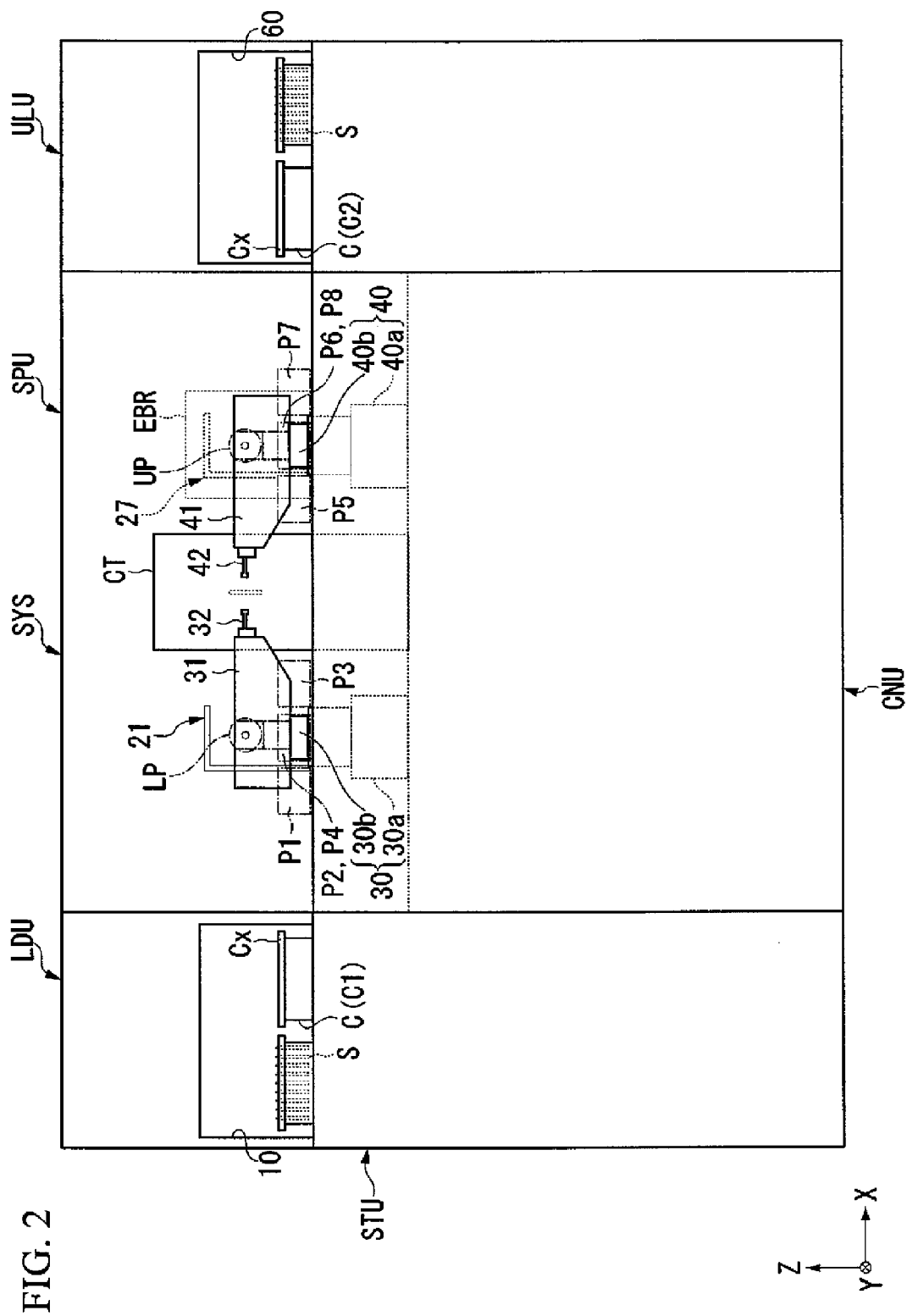
FIG. 2 is a front view showing the constitution of the substrate processing system according to the embodiment of the invention.
Figure 3:
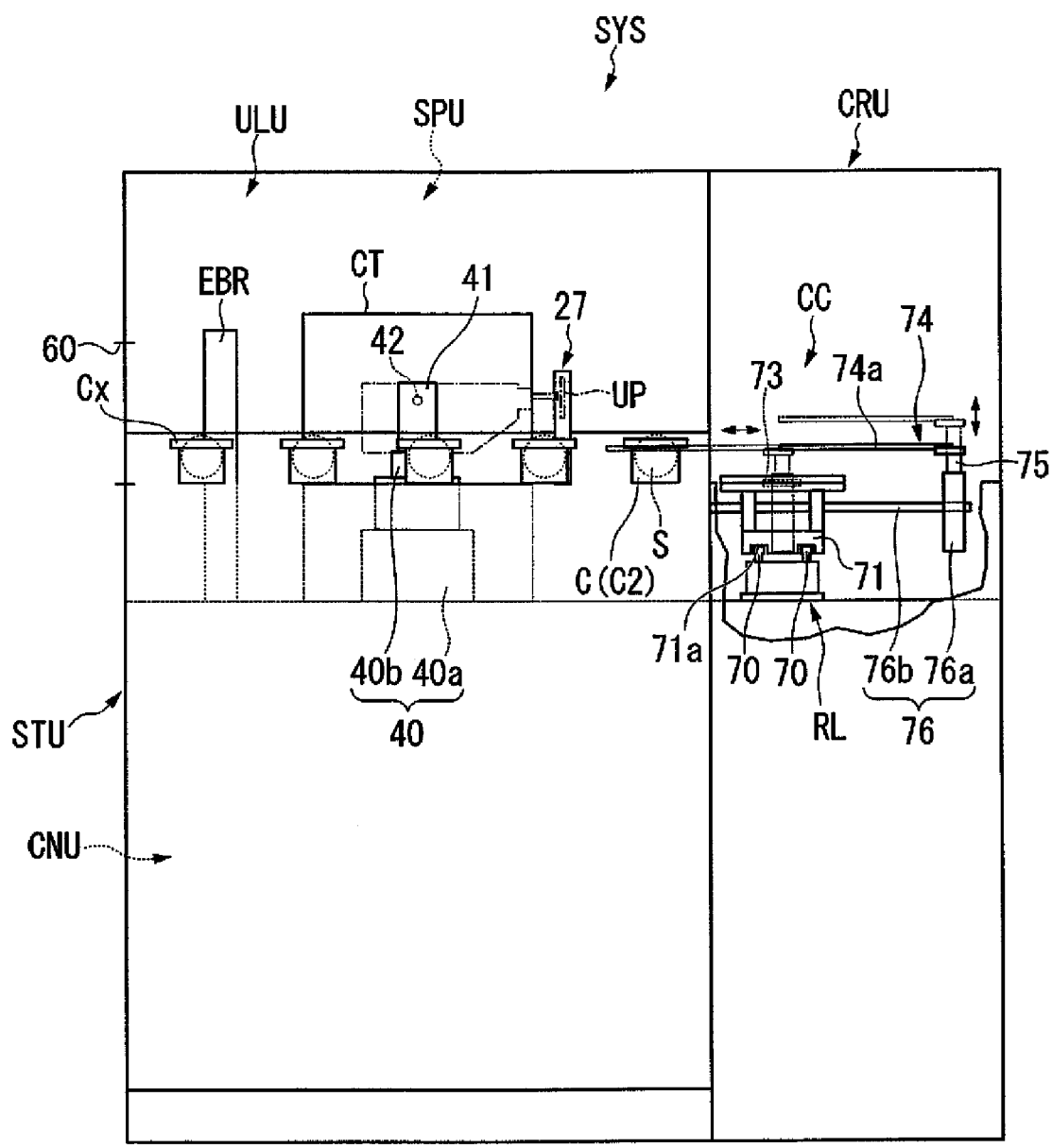
FIG. 3 is a side view showing the constitution of the substrate processing system according to the embodiment of the invention.

FIG. 1 is a plan view showing a schematic constitution of a substrate processing system SYS according to the embodiment of the invention. FIG. 2 is a front view showing the schematic constitution of the substrate processing system SYS. FIG. 3 is a side view showing the schematic constitution of the substrate processing system SYS.

In the embodiment, when describing the constitution of the substrate processing system SYS, for the purpose of simple markings, an XYZ coordinate system is used to describe the directions in the drawings. In the XYZ coordinate system, the horizontal direction in the drawing is marked as the X direction, and the direction perpendicular to the X direction in plan view is marked as the Y direction. The direction perpendicular to a plane including the X and Y axes is marked as the Z direction. In the X, Y, and Z directions, the arrow direction in the drawing is the +direction, and the opposite direction of the arrow direction is the −direction.

As shown in FIGS. 1 to 3, the substrate processing system SYS is a system which is incorporated into, for example, a manufacturing line of a factory or the like and forms a thin film on a predetermined area of a substrate S. The substrate processing system SYS includes a stage unit STU, a substrate processing unit (coating device) SPU, a substrate loading unit LDU, a substrate unloading unit ULU, a carrying unit CRU, and a control unit CNU.

In the substrate processing system SYS, the stage unit STU is supported on a floor surface through, for example, a bridge member or the like. The substrate processing unit SPU, the substrate loading unit LDU, the substrate unloading unit ULU, and the carrying unit CRU are disposed on the upper surface of the stage unit STU. In the substrate processing unit SPU, each inside of the substrate loading unit LDU, the substrate unloading unit ULU, and the carrying unit CRU is covered by a cover member. In the substrate processing system SYS, the substrate processing unit SPU, the substrate loading unit LDU, and the substrate unloading unit ULU are arranged in a linear shape along the X direction. The substrate processing unit SPU is disposed between the substrate loading unit LDU and the substrate unloading unit ULU. In a portion of the stage unit STU where the substrate processing unit SPU is disposed, a center thereof in plan view is recessed in the −Z direction relative to other portions.

As the substrate S as a processing object of the substrate processing system SYS according to the embodiment, for example, a semiconductor substrate such as silicon, a glass substrate forming a liquid crystal panel, a substrate forming a hard disk, and the like may be exemplified. In the embodiment, as the substrate S, a substrate which forms a hard disk is an exemplary example. The substrate is formed of glass, and is formed as a disk-shaped base, of which a surface is coated with diamond and in which an opening is formed at the center thereof in plan view.

A loading operation and an unloading operation of the substrate S in the substrate processing system SYS according to the embodiment are performed by a cassette C capable of accommodating plural sheets of the substrates S. The cassette C is a container formed in a square shape, and is capable of accommodating plural sheets of substrates S in series so that the substrate surfaces face each other. Accordingly, the cassette C is configured to accommodate the substrates S in the state where the substrates S are erected in the Z direction. The cassette C has an opening formed in a bottom portion thereof. Each of the substrates S is accommodated so as to be exposed from the bottom portion of the cassette C through the opening. The cassette C is formed in a rectangular shape in plan view, and has, for example, an engagement portion Cx formed in the +Z direction side edge portion as shown in FIG. 2. In the embodiment, as the cassette C, two types of cassettes, that is, a loading cassette C1 for loading the substrate S and an unloading cassette C2 for unloading the substrate S are used. The loading cassette C1 accommodates only the unprocessed substrate S, and the unloading cassette C2 accommodates only the processed substrate S. The loading cassette C1 is used between the substrate processing unit SPU and the substrate loading unit LDU. The unloading cassette C2 is used between the substrate processing unit SPU and the substrate unloading unit ULU. Accordingly, the loading cassette C1 and the unloading cassette C2 are not used together. The loading cassette C1 and the unloading cassette C2 are formed to have, for example, the same shape and size.

Substrate Loading Unit

The substrate loading unit LDU is disposed on the −X direction side of the substrate processing system SYS. The substrate loading unit LDU is a unit which receives the loading cassette C1 accommodating the unprocessed substrate S, and which collects the empty loading cassette C1. The substrate loading unit LDU is elongated in the Y direction, and is capable of accommodating a plurality of loading cassettes C1 arranged in the Y direction in a standby state.

The substrate loading unit LDU includes a cassette entrance 10 and a cassette moving mechanism (second moving mechanism) 11. The cassette entrance 10 is an opening which is provided in the −Y direction side of the cover member covering the substrate loading unit LDU. The cassette entrance 10 is an inlet (supply opening) for the loading cassette C1 accommodating the unprocessed substrates S, and an outlet (collection opening) for the empty loading cassette C1.

The cassette moving mechanism 11 includes, for example, a driving mechanism such as a belt conveyor mechanism. In the embodiment, as the driving mechanism, conveyor belts (a supply belt 11a and a collection belt 11b) are provided. The conveyor belts extend in the Y direction from the +Y direction side end portion of the substrate loading unit LDU to the −Y direction side end portion thereof, where two conveyor belts extend in the X direction.

Among the two conveyor belts, the supply belt 11a is a conveyor belt which is disposed on the −X direction side. The +Z direction side surface of the supply belt 11a is used as a conveyor surface. The supply belt 11a is configured to rotate so that the conveyor surface moves in the +Y direction. A plurality of loading cassettes C1, which enter the substrate loading unit LDU through the cassette entrance 10, are placed on the conveyor surface of the supply belt 11a. The loading cassettes C1 are moved to the carrying unit CRU by rotation of the supply belt 11a.

Among two conveyor belts, the collection belt 11b is a conveyor belt which is disposed on the +X direction side. The +Z direction side surface of the collection belt 11b is used as a conveyor surface. The collection belt 11b is configured to rotate so that the conveyor surface moves in the −Y direction. Plural empty loading cassettes C1 are placed on the conveyor surface of the collection belt 11b. The loading cassettes C1 are made to move to the cassette entrance 10 by rotation of the collection belt 11b.

In the embodiment, for example, the loading cassettes C1 are capable of staying in a standby state at standby positions (container standby portion) provided at five positions on the supply belt 11a and the collection belt 11b. In the substrate loading unit LDU, it is possible to move the standby position of the loading cassette C1 by rotating the supply belt 11a and the collection belt 11b. It is possible to shorten the carrying time of the loading cassette C1 by moving the standby position.

Substrate Processing Unit

The substrate processing unit SPU is disposed in the substrate processing system SYS so as to be substantially located at the center in the X direction. The substrate processing unit SPU is a unit which performs various processes such as a process of coating a liquid material such as resist on the substrate S so as to form a thin film thereon and a process of removing the thin film formed on the peripheral portion of the substrate S. The substrate processing unit SPU includes a buffer mechanism BF, a substrate carrying mechanism (rotary mechanism) SC, a coating mechanism CT, and a peripheral edge removing mechanism (adjusting portion) EBR, and a dummy substrate holding mechanism DSH.

The buffer mechanisms BF are respectively provided at two positions along the +Y direction side edge of the substrate processing unit SPU with the coating mechanism CT interposed therebetween in the X direction. Among the buffer mechanisms BF at two positions, the buffer mechanism disposed on the −X direction side of the coating mechanism CT is a loading buffer mechanism (substrate loading area) BF1, and the buffer mechanism disposed on the +X direction side of the coating mechanism CT is an unloading buffer mechanism (substrate unloading area) BF2.

The loading buffer mechanism BF1 is a portion where the loading cassette C1 supplied to the substrate processing unit SPU stays in a standby state. The loading buffer mechanism BF1 is provided with a cassette moving mechanism (third moving mechanism) 20. The cassette moving mechanism 20 includes, for example, a driving mechanism such as a conveyor mechanism. In the embodiment, as the driving mechanism, two conveyor belts 20a and 20b are provided.

The conveyor belt 20a is provided in an area in the X direction of the loading buffer mechanism BF1. The +Z direction side surface of the conveyor belt 20a is used as a conveyor surface, and the supplied loading cassette C1 is placed on the conveyor surface. The conveyor belt 20a is adapted to rotate so that the conveyor surface moves in X direction. It is possible to move the loading cassette C1 in the X direction of the loading buffer mechanism BF1 by rotating the conveyor belt 20a. The conveyor belt 20b is provided at the center in the X direction of the loading buffer mechanism BF1. The +Z direction side surface of the conveyor belt 20b is used as a conveyor surface, and the loading cassette C1 is placed on the conveyor surface. The conveyor belt 20b is adapted to rotate so that the conveyor surface moves in the Y direction. By the rotation of the conveyor belt 20b, the loading cassette C1 moves in the Y direction. In this manner, the cassette moving mechanism 20 moves the standby position of the loading cassette C1.

In the loading buffer mechanism BF1, plural, for example, three, loading cassettes C1 are arranged in the X direction of the formation area of the conveyor belt 20a so as to stay in a standby state (second container standby portion). The standby position P1 on the −X direction side of the drawing is, for example, a standby position for the loading cassette C1 supplied to the substrate processing unit SPU. The standby position P2 at the center in the X direction of the drawing is a standby position for the loading cassette C1 moving from the standby position P1. The standby position P3 on the +X direction side of the drawing is a standby position for the loading cassette C1 moving from the standby position P2.

The +Y direction side end portion of the conveyor belt 20b is disposed inside the standby position P2. For this reason, the loading cassette C1 disposed at the standby position P2 moves in the −Y direction side relative to the standby position P2 by the conveyor belt 20b, and stays at the standby position P4 in a standby state. A loading position LP for the substrate S is provided on the +Z direction side of the standby position P4. The substrate S is carried to the coating mechanism CT through the loading position LP.

The unloading buffer mechanism BF2 is a portion of the substrate processing unit SPU where the unloading cassette C2 supplied to the substrate processing unit SPU stays in a standby state. The unloading buffer mechanism BF2 is provided with a cassette moving mechanism (third moving mechanism) 22. The cassette moving mechanism 22 includes, for example, a driving mechanism such as a belt conveyor. In the embodiment, as in the loading buffer mechanism BF1, two conveyor belts 22a and 22b are provided as the driving mechanism.

The conveyor belt 22a is provided in an area in the X direction of the unloading buffer mechanism BF2. The +Z direction side surface of the conveyor belt 22a is used as a conveyor surface, and the supplied unloading cassette C2 is placed on the conveyor surface. The conveyor belt 22a is adapted to rotate so that the conveyor surface moves in the X direction. It is possible to move the unloading cassette C2 in the X direction of the unloading buffer mechanism BF2 by rotating of the conveyor belt 22a. The conveyor belt 22b is provided at the center in the X direction of the unloading buffer mechanism BF2. As in the conveyor belt 20b, the +Z direction side surface of the conveyor belt 22b is used as a conveyor surface, and the unloading cassette C2 is placed on the conveyor surface. The conveyor belt 22b is adapted to rotate so that the conveyor surface moves in the Y direction. By the rotation of the conveyor belt 22b, the unloading cassette C2 moves in the Y direction. In this manner, the cassette moving mechanism 22 moves the standby position of the unloading cassette C2.

In the unloading buffer mechanism BF2, a plurality, for example, three, of unloading cassettes C2 are arranged in the X direction on the conveyor belt 22a so as to stay in a standby state (second container standby portion). The standby position P5 on the −X direction side of the drawing is, for example, a standby position for the unloading cassette C2 supplied to the substrate processing unit SPU. The standby position P6 at the center in the X direction of the drawing is a standby position for the unloading cassette C2 moving from the standby position P5. The standby position P7 on the +X direction side of the drawing is a standby position for the unloading cassette C2 moving from the standby position P6.

The +Y-direction-side end portion of the conveyor belt 22b is disposed inside the standby position P6. For this reason, the unloading cassette C2 disposed at the standby position P6 moves in the −Y direction side relative to the standby position P6 by the conveyor belt 22b, and stays at the standby position P8 in a standby state. An unloading position UP for the substrate S is provided on the +Z direction side of the standby position P8. The substrate S is carried from the coating mechanism CT to the unloading cassette C2 through the unloading position UP.

Figure 4:
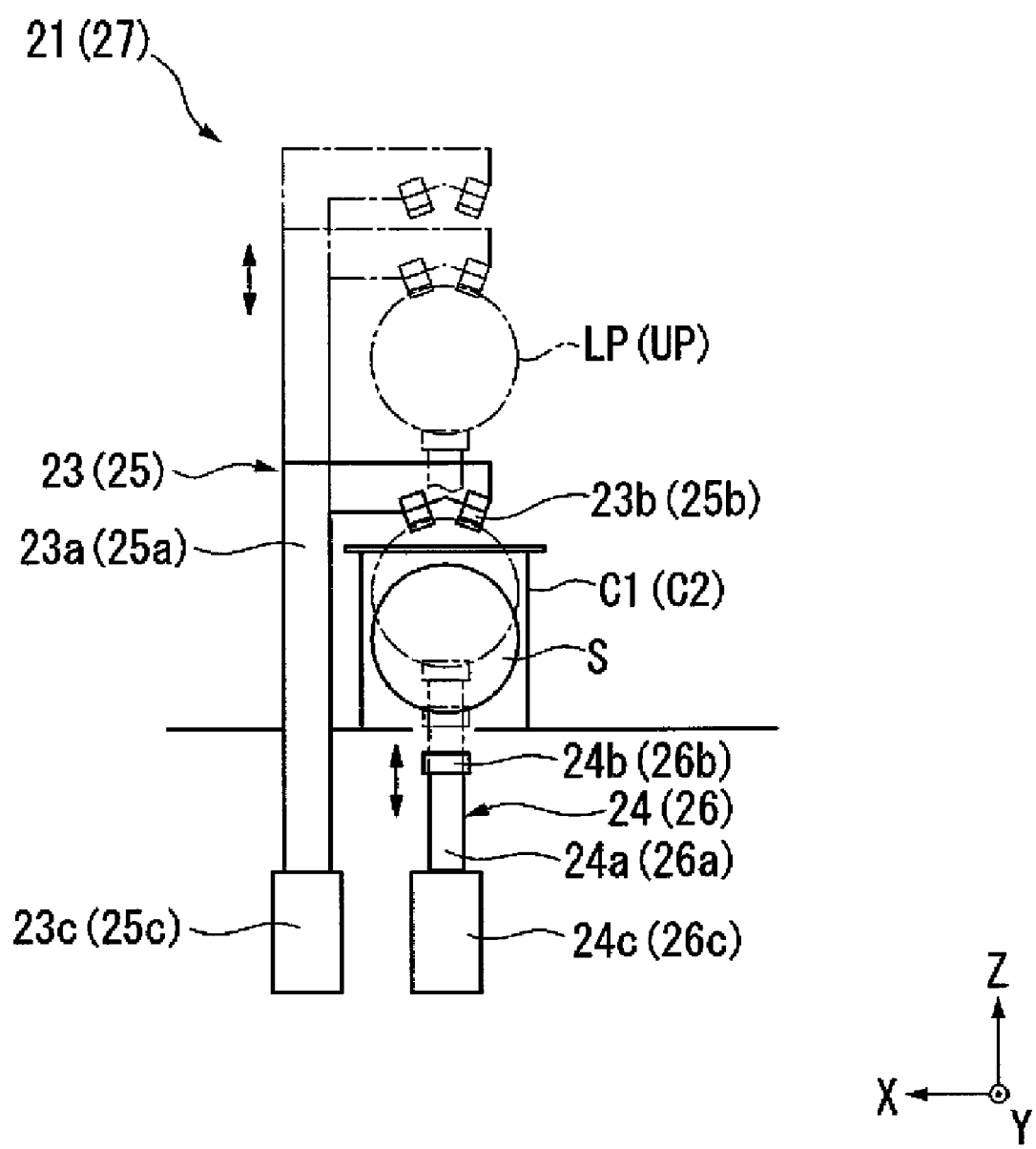
FIG. 4 is a view showing a constitution of a substrate loading mechanism and a substrate unloading mechanism.
Figure 5:
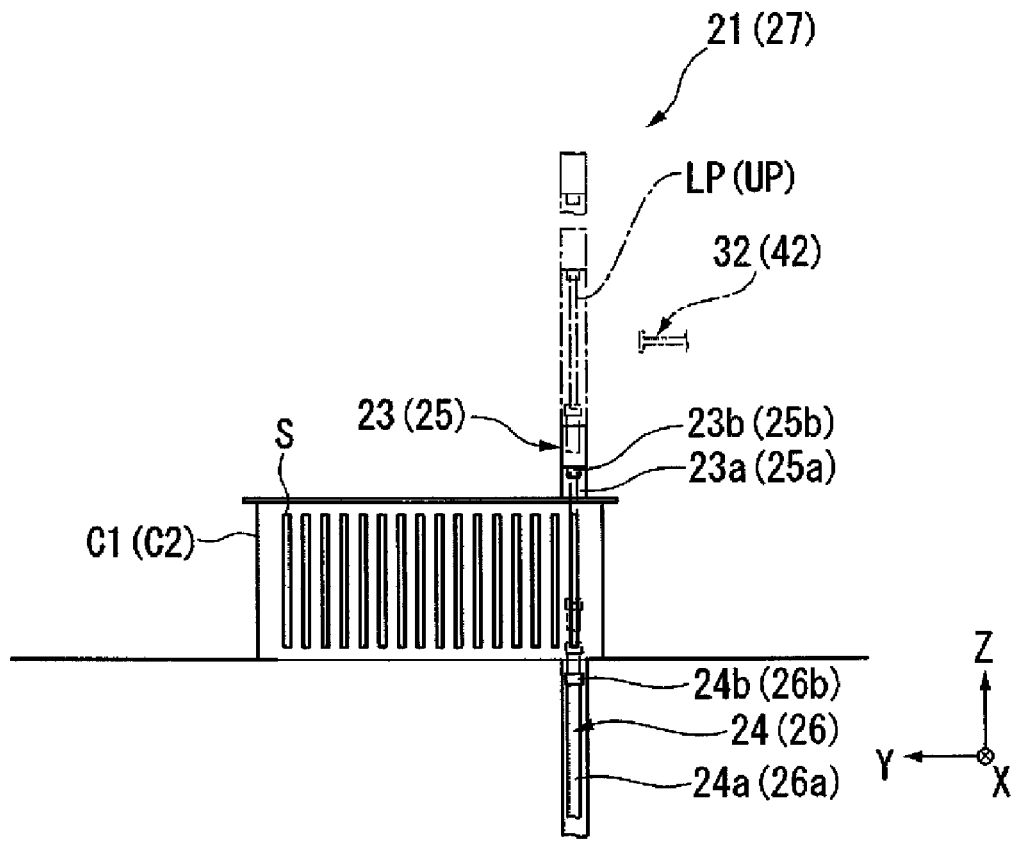
FIG. 5 is a view showing the constitution of the substrate loading mechanism and the substrate unloading mechanism.
Figure 6:
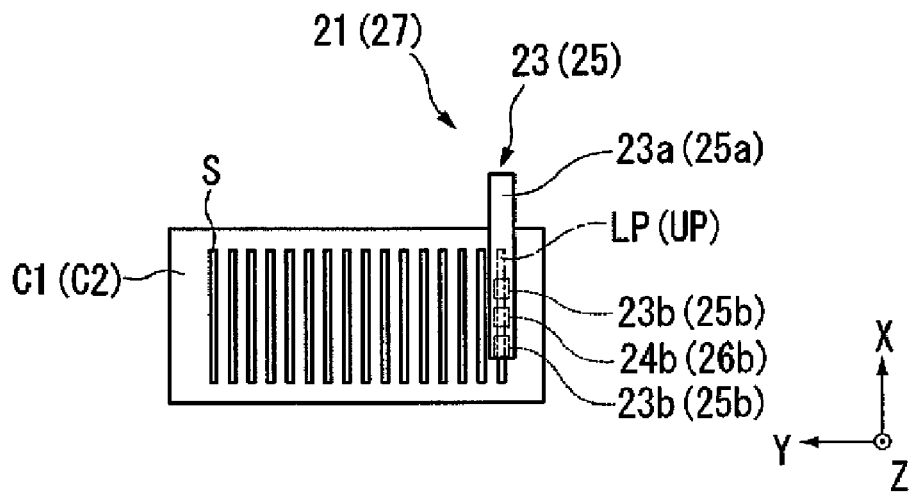
FIG. 6 is a view showing the constitution of the substrate loading mechanism and the substrate unloading mechanism.

The substrate processing unit SPU includes a substrate loading mechanism 21 and a substrate unloading mechanism 27 in the vicinity of the buffer mechanism BF. The substrate loading mechanism 21 is disposed in the vicinity of the standby position P4. FIGS. 4 to 6 are views schematically showing a constitution of the substrate loading mechanism 21.

As shown in the drawings, the substrate loading mechanism 21 includes a substrate upper portion holding mechanism 23 and a substrate lower portion holding mechanism 24. The substrate upper portion holding mechanism 23 is disposed on the +X direction side of the standby position P4. The substrate upper portion holding mechanism 23 moves in the Z direction while holding the +Z direction side portion of the substrate S. The substrate upper portion holding mechanism 23 includes a raising and lowering member 23a, a clamping member 23b, and a raising and lowering mechanism 23c.

The raising and lowering member 23a is a column member which is formed in an L-shape in side view and is movable in the Z direction. The raising and lowering member 23a includes a column portion which extends in the Z direction and a protrusion which protrudes from the front end of the column portion in the X direction. Among them, the column portion is provided up to the +Z direction side of the +Z direction side end surface of the loading cassette C1. The protrusion of the raising and lowering member 23a is disposed at a position overlapping with the loading position LP in plan view. The −Z direction side portion of the protrusion is provided with a concave portion matching with the shape of the substrate S.

The clamping member 23b is mounted to the concave portion of the raising and lowering member 23a. Accordingly, the clamping member 23b is provided at a position overlapping with the loading position LP in plan view. The raising and lowering mechanism 23c is a driving portion which is mounted to the raising and lowering member 23a, and is disposed on the −Z direction side of the loading cassette C1. As the raising and lowering mechanism 23c, for example, a driving mechanism such as an air cylinder may be used.

The substrate lower portion holding mechanism 24 is provided at a position overlapping with the center of the loading position LP in plan view. The substrate lower portion holding mechanism 24 moves in the Z direction while holding the −Z direction side portion of the substrate S. The substrate lower portion holding mechanism 24 includes a raising and lowering member 24a, a clamping member 24b, and a raising and lowering mechanism 24c. The raising and lowering member 24a is a column member which is formed in a bar shape and is movable in the Z direction. The clamping member 24b is mounted to the +Z direction side front end of the raising and lowering member 24a. The clamping member 24b is disposed at a position overlapping with the center of the loading position LP in plan view. The raising and lowering mechanism 24c is a driving portion which is mounted to the raising and lowering member 24a, and is disposed on the −Z direction side of the loading cassette C1. As the raising and lowering mechanism 24c, for example, a driving mechanism such as an air cylinder may be used.

It is possible to separately operate the raising and lowering mechanism 23c of the substrate upper portion holding mechanism 23 and the raising and lowering mechanism 24c of the substrate lower portion holding mechanism 24, and to operate them in an interlocking manner.

The substrate unloading mechanism 27 is disposed in the vicinity of the standby position P8. The substrate unloading mechanism 27 has the same constitution as that of the substrate loading mechanism 21. In FIGS. 4 to 6, the constituents (including the unloading position UP) of the substrate unloading mechanism 27 corresponding to the constituents (including the loading position LP) of the substrate loading mechanism 21 are indicated by the parenthesized signs.

The substrate unloading mechanism 27 includes a substrate upper portion holding mechanism 25 and a substrate lower portion holding mechanism 26. The substrate upper portion holding mechanism 25 includes a raising and lowering member 25a, a clamping member 25b, and a raising and lowering mechanism 25c. The substrate lower portion holding mechanism 26 includes a raising and lowering member 26a, a clamping member 26b, and a raising and lowering mechanism 26c. Since the positional relationship, the function, and the like of the respective constituents of the substrate unloading mechanism 27 are the same as those of the corresponding constituents of the substrate loading mechanism 21, a description thereof will be omitted.

The substrate carrying mechanisms SC are provided at two positions with the coating mechanism CT interposed therebetween in the X direction so as to be located at the center in the Y direction of the substrate processing unit SPU. Among the substrate carrying mechanisms SC at two positions, a device disposed on the −X direction side of the coating mechanism CT is a loading carrying mechanism SC1, and a device disposed on the +X direction side of the coating mechanism CT is an unloading carrying device SC2. The loading carrying mechanism SC1, the unloading carrying mechanism SC2, and the coating mechanism CT are arranged in a linear shape in the X direction.

Figure 7:
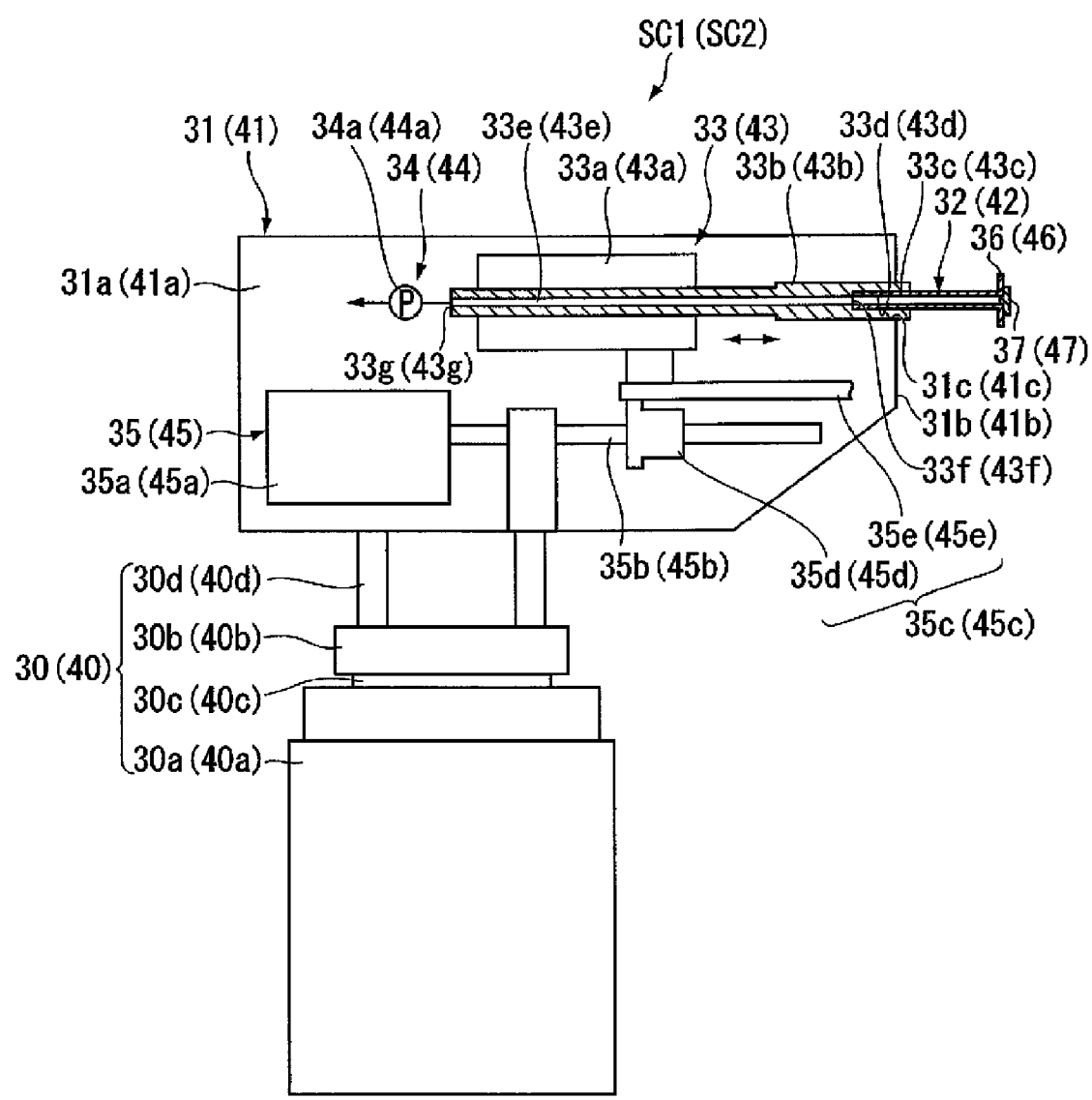
FIG. 7 is a view showing a constitution of the holding portion.

The loading carrying mechanism SC1 accesses the coating mechanism CT and the loading position LP of the loading buffer mechanism BF1 so as to carry the substrate S therebetween. FIG. 7 is a schematic view showing a constitution of the loading carrying mechanism. As shown in FIG. 7, the loading carrying mechanism SC1 includes a base portion 30, an arm portion 31, and a holding portion 32.

The base portion 30 is provided on the upper surface of the recessed portion of the stage unit STU. The base 30 includes a fixed table 30a, a rotary table 30b, a rotary mechanism 30c, and support members 30d.

The fixed table 30a is fixed to the upper surface of the recessed portion of the stage unit STU. The base portion 30 is fixed onto the stage unit SUT through the fixed table 30a so that no positional deviation occurs. The rotary table 30b is disposed on the fixed table 30a through the rotary mechanism 30c. The rotary table 30b is adapted to be rotatable about the Z axis serving as the rotary axis relative to the fixed table 30a. The rotary mechanism 30c is a driving mechanism which is provided between the fixed table 30a and the rotary table 30b, and applies the rotation force to the rotary table 30b. Each of the support members 30d is a column member of which the −Z direction side end portion is fixed onto the rotary table 30b. The support members 30d are provided at a plurality of positions, for example, two positions of the rotary table 30b. The +Z direction side end portion of the support member 30d is inserted into the arm portion 31.

The arm portion 31 is supported by the support members 30d of the base portion 30. The arm portion 31 moves the holding portion 32 to different positions inside the substrate processing unit SPU. The arm portion 31 includes a casing 31a formed in a pentagonal column. A front end surface 31b of the casing 31a is provided with an opening 31c. A rotary mechanism 33, a suction mechanism 34, and a moving mechanism 35 are provided inside the casing 31a.

The rotary mechanism 33 is disposed on the +Z direction side inside the casing 31a. The rotary mechanism 33 includes a motor device 33a and a rotary shaft member 33b. The motor device 33a and the rotary shaft member 33b are adapted to be movable together in the horizontal direction in the drawing. The motor device 33a is a driving device which applies the rotation force to the rotary shaft member 33b. The rotary shaft member 33b is a bar-shaped member which has a circular section and is disposed in parallel to the XY plane.

The rotary shaft member 33b is adapted to be rotatable about the center of the circle serving as the rotary axis by the driving force of the motor device 33a. The rotary shaft member 33b is disposed so that one end thereof protrudes from the opening 31c to the outside of the casing 31a (protrusion 33c). The end surface of the rotary shaft member 33b on the side of the protrusion 33c is provided with a concave portion 33d used for mounting the holding portion 32 thereto. The concave portion 33d is formed in a circular shape in sectional view. The protrusion 33c includes a fixing mechanism which fixes the holding portion 32 in the state where the holding portion 32 is mounted to the concave portion 33d. Since the holding portion 32 is fixed by the fixing mechanism, the rotary shaft member 33b and the holding portion 32 are adapted to be movable together.

The rotary shaft member 33b includes a perforation hole 33e. The perforation hole 33e is formed so as to perforate from a bottom surface 33f of the concave portion 33d of the rotary shaft member 33b to an end surface 33g on the other side of the rotary shaft member 33b. The bottom surface 33f of the concave portion 33d of the rotary shaft member 33b communicates with the end surface 33g through the perforation hole 33e.

The suction mechanism 34 is provided in the end surface 33g of the rotary shaft member 33b. The suctioning means 34 includes a suctioning device such as a suction pump 34a. The suction pump 34a is connected to the perforation hole 33e of the end surface 33g of the rotary shaft member 33b. The suction pump 34a suctions the perforation hole 33e from the end surface 33g of the rotary shaft member 33b, thereby suctioning the holding portion 32 disposed on the bottom surface 33f of the concave portion 33d communicating with the perforation hole 33e.

The moving mechanism 35 is disposed on the −Z direction side inside the casing 31a. The moving mechanism 35 includes a motor device 35a, a rotary shaft member 35b, and a movable member 35c. The motor device 35a is a driving device which applies the rotation force to the rotary shaft member 35b. The rotary shaft member 35b is a bar-shaped member which has a circular section and of which one end is inserted in the motor device 35a. The rotary shaft member 35b is adapted to be rotatable about the center of the circle serving as the rotary axis by the motor device 35a. A screw thread (not shown) is formed on the surface of the rotary shaft member 35b.

The movable member 35c includes a screw-connection portion 35d and a connection portion 35e. The screw-connection portion 35d is integrally formed with the rotary shaft member 35b, and has a screw thread (not shown) formed on the surface thereof. The connection portion 35e is fixed to, for example, the motor device 33a of the rotary mechanism 33. A screw thread is formed on the lower surface of the connection member 35e, and adapted to mesh with the screw thread formed in the screw-connection portion 35d.

When the motor device 35a rotates the rotary shaft member 35b, the rotary shaft member 35b and the screw-connection portion 35d are adapted to rotate together. By rotation of the screw-connection portion 35d, the connection member 35e meshing with the screw thread of the screw-connection portion 35d is adapted to move in the left or right direction in the drawing, and the connection member 35e and the fixing mechanism 33 fixed to the connection member 35e are adapted to move together in the left or right direction in the drawing. By means of the movement, the holding portion 32 provided in the right end of the rotary mechanism 33 in the drawing is adapted to move in the horizontal direction in the drawing.

The holding portion 32 is separably fixed to the concave portion 33d of the arm portion 31. The holding portion 32 holds, for example, the substrate S using a holding force such as the absorption force. The holding portion 32 includes a suction member 36 and a blocking member 37. The suction member 36 and the blocking member 37 are separably provided.

The loading carrying mechanism SC1 with the above-described constitution allows the holding portion 32 to access both the coating mechanism CT and the loading position LP in such a manner that the arm portion 31 rotates about the Z axis serving as the rotary axis or moves in the XY plane. The loading carrying mechanism SC1 can hold the substrate S by the suctioning force of the suction pump 34a in the arm portion 31 so as to be upright in the Z direction, and it is possible to rotate the substrate S so as to be upright in the Z direction by rotating the rotary shaft member 33b in the arm portion 31. The state where the substrate is upright in the Z direction refers to the state where the substrate S is inclined with respect to a horizontal plane. In the embodiment, it is preferable to rotate the substrate by holding it in the state where it is upright at an angle equal to or more than 70° and equal to or less than 90° with respect to a horizontal plane. The rotary shaft members disposed in the arm portion 31 for rotating the substrate may have a constitution in which a plurality of shaft members are connected through couplings.

Returning to FIGS. 1 to 3, the unloading carrying mechanism SC2 accesses the coating mechanism CT, the unloading position UP of the unloading buffer mechanism BF2, and the peripheral edge removing mechanism EBR so as to carry the substrate S therebetween. The unloading carrying mechanism SC2 includes a base portion 40 (a fixed table 40a and a rotary table 40b), an arm portion 41, and a holding portion 42. Since the constitution of the unloading carrying mechanism SC2 is the same as that of the loading carrying mechanism SC1, the description of the respective constituents will be omitted. In FIG. 7, the constituents of the unloading carrying mechanism SC2 corresponding to the constituents of the loading carrying mechanism SC1 are indicated by the parenthesized signs. Hereinafter, when mentioning the constituents of the unloading carrying mechanism SC2, the names of the corresponding constituents of the loading carrying mechanism SC1 are used, and the parenthesized signs in FIG. 7 are respectively added to the names.

Figure 8:
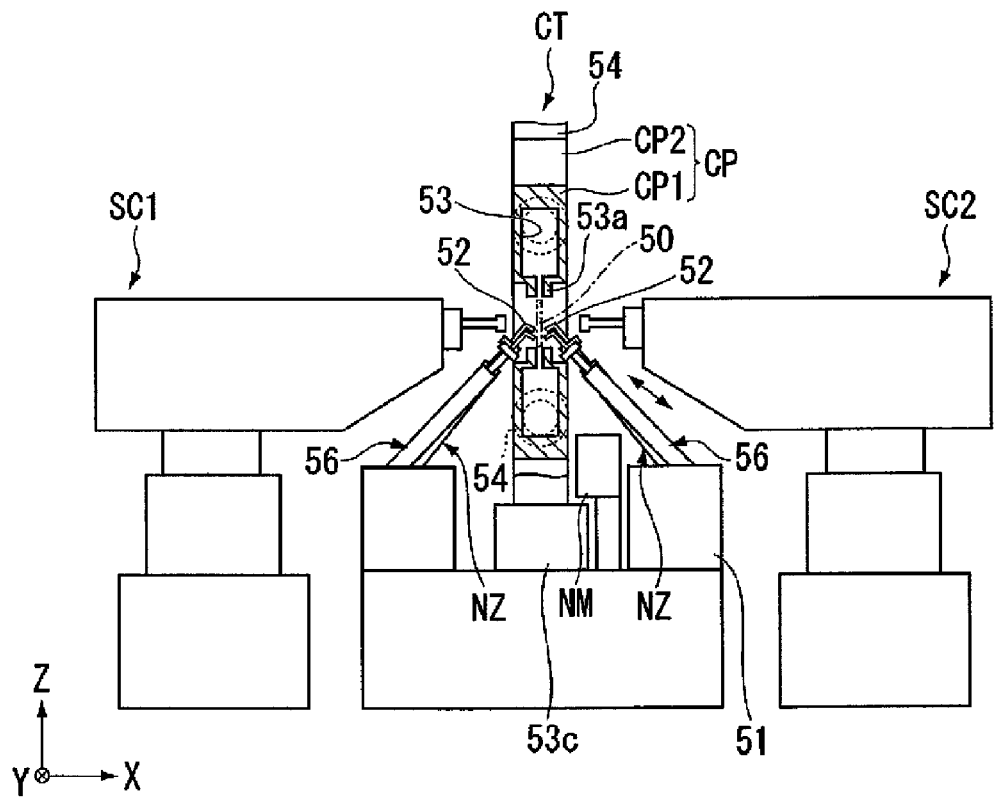
FIG. 8 is a front view showing a constitution of a substrate processing unit.
Figure 9:
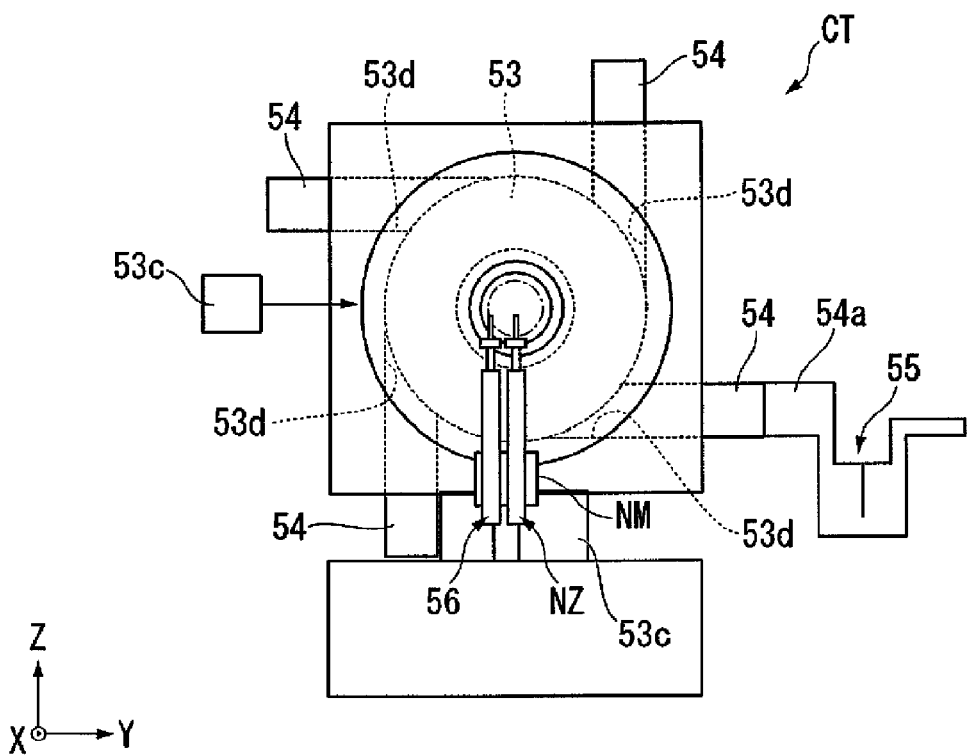
FIG. 9 is a side view showing the constitution of the substrate processing unit.
Figure 10:
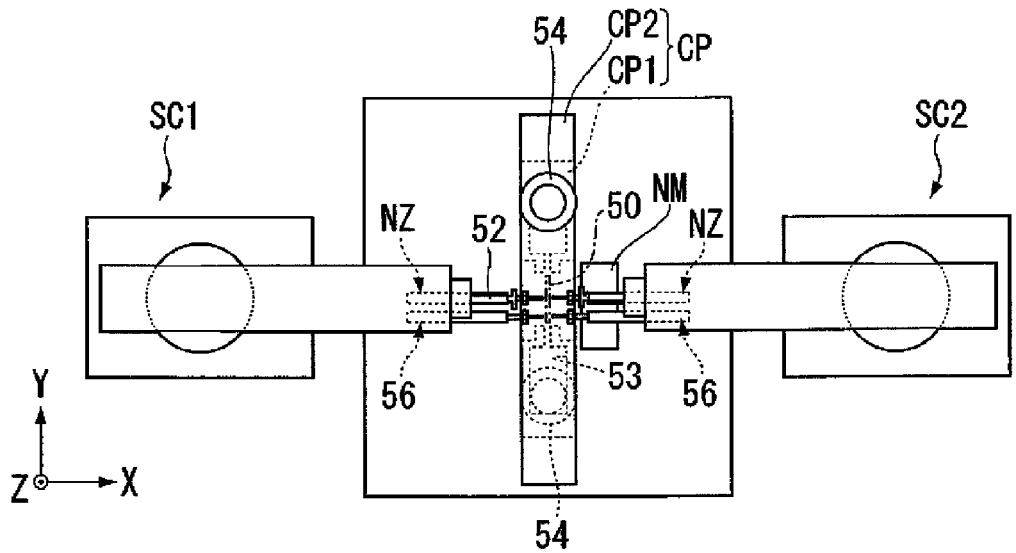
FIG. 10 is a plan view showing the constitution of the substrate processing unit.

The coating mechanism CT is substantially disposed at the center of the substrate processing unit SPU in plan view, and is fixed to the upper surface of the recessed portion of the stage unit STU. The coating mechanism CT is a device which coats a liquid material on the substrate S so as to form a thin film thereon. In the embodiment, the coating mechanism CT forms a thin film, used to perform an imprinting process, on the substrate S. The access to the coating device CT is possible from both the −X direction side and +X direction side of the coating mechanism CT. Accordingly, for example, the loading operation and the unloading operation of the substrate S are possible from both the −X direction side and the +X direction side. The coating device CT is configured to perform a coating process at a coating position (a position depicted by the dashed line in the drawing) 50 substantially positioned in the center of the STU unit in the X direction. FIGS. 8 to 10 are views showing a constitution of the coating mechanism CT. The coating mechanism CT includes a nozzle portion NZ, a cup portion CP, and a nozzle managing mechanism NM.

Figure 11:
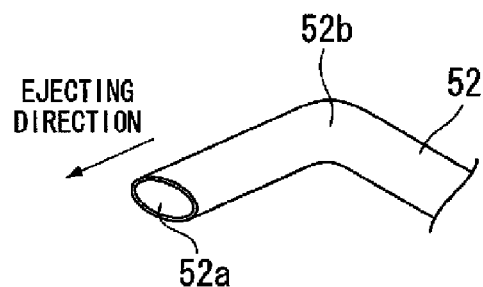
FIG. 11 is a view showing a constitution of a front end of a nozzle.

The nozzle portions NZ are provided so as to access the center in the Y direction of the coating position 50 by using the nozzle moving mechanism 51. The nozzle portions NZ are respectively disposed on the +X direction side and the −X direction side of the coating position 50. Each nozzle portion NZ includes the nozzle 52 which ejects the liquid material as a material forming the thin film onto the substrate S. The nozzle 52 is formed by bending at the bent portion 52b so as to eject the liquid material from the center of the substrate S to the outer periphery thereof when the nozzle accesses the coating position. The nozzle 52 is provided on the −Z direction side of the rotary axis of the substrate S. The nozzles 52 are disposed at the same positions of the front surface (+X direction side) and the rear surface (−X direction side) of the substrate S relative to the coating position 50 so as to be symmetric to each other in the X direction. As shown in FIG. 11, the ejecting surface 52a of the front end of the nozzle 52 is inclined relative to the ejecting direction of the liquid material. Since the front end of the nozzle 52 is sharp, for example, it is possible for the liquid material to neatly run out from the nozzle upon stopping of the coating operation using the liquid material.

The cup portion CP includes the inner cup CP1 and the outer cup CP2. The inner cup CP1 is formed in a circular shape when viewed in the X direction, and is disposed so as to surround the side portion of the substrate S disposed at the coating position 50. The outer cup CP2 is formed in a square shape when viewed in the X direction, and supports the outside portion of the inner cup CP1. The outer cup CP2 is fixed to the upper surface of the stage unit STU through, for example, a support member or the like. In the embodiment, the inner cup CP1 and the outer cup CP2 are integrally formed with each other, but may, of course, be separated from each other.

The inner cup CP1 includes an accommodation portion 53 which accommodates the liquid material. The accommodation portion 53 is provided with the discharging mechanism 54 which discharges at least one of the liquid material and gas inside the accommodation portion 53. The discharging mechanism 54 is provided along the tangential direction of the outer periphery of the inner cup CP1 formed in a circular shape. As shown in FIG. 9, the discharging mechanism 54 is connected to an opening 53d of the inner cup CP1 through a flow path such as piping provided inside the outer cup CP2. In this way, the discharging mechanism 54 is connected to the inside of the accommodation portion 53 of the inner cup CP1 through the piping and the opening 53d. In addition, the shape of the opening 53d is not limited to a shape along the tangential direction of the inner cup CP1 as shown in FIG. 9. For example, the shape of the opening 53d may be a shape along the radial direction of the inner cup CP1. In this case, for example, the discharging mechanism 54 may be disposed in the four corners or in the center of each of the four sides of the outer cup CP2. As shown in FIG. 9, for example, the discharging mechanism 54 is provided in each of four edges of the outer cup CP2, where the number of discharging mechanisms 54 is four in total. As shown in FIG. 9, each discharging mechanism 54 is connected to each discharge path. Each discharge path is provided with a trap mechanism 55 which is a gas-liquid separating mechanism for separating a gas and a liquid. In addition, the discharge path and the trap mechanism 55 for other discharge mechanisms 54 shown in FIGS. 8 to 10 are not shown in the drawing.

Figure 12:
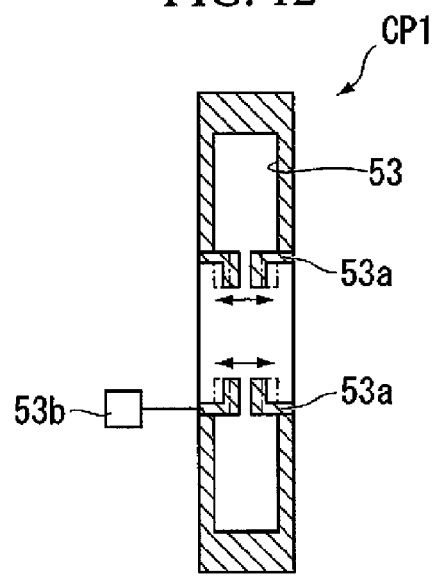
FIG. 12 is a view showing a constitution of an inner cup.

As the inlet of the accommodation portion 53, the facing portion 53a of the inner cup CP1 facing the side portion of the substrate S is separably mounted to other portions of the inner cup CP1. As shown in FIG. 12, the inner cup CP1 includes the adjusting mechanism 53b which adjusts the dimension of the opening of the facing portion 53a. For example, it is possible to adjust the dimension of the opening by using the adjusting mechanism 53b in accordance with the thickness of the substrate S or the bouncing state of the coating liquid. The −Y direction side portion of the nozzle 52 is provided with the cleaning liquid nozzle portion 56 which ejects the cleaning liquid of the cup portion CP to the substrate S.

Figure 13:
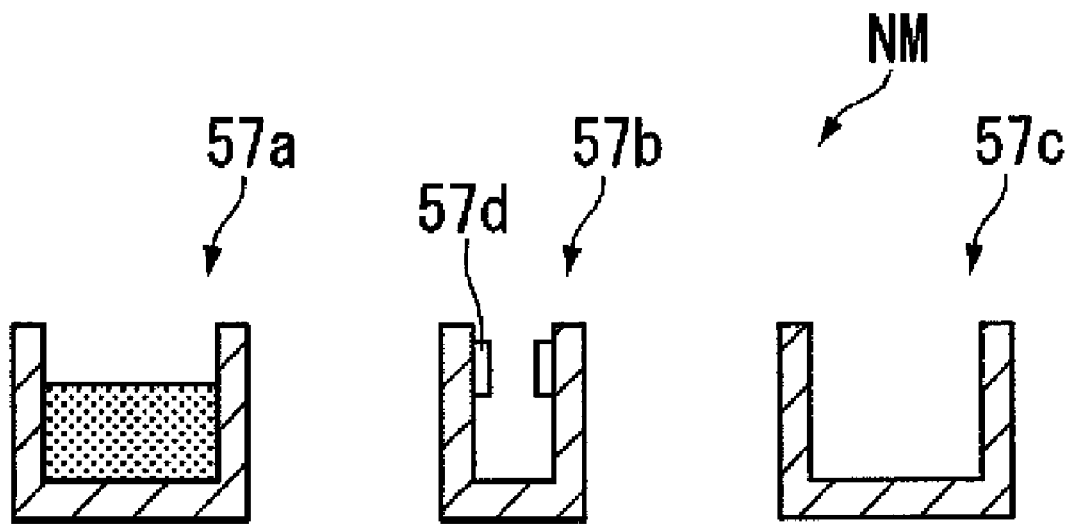
FIG. 13 is a view showing a constitution of a nozzle managing mechanism.

The nozzle managing mechanism NM manages the nozzle 52 so that the ejecting state thereof is steady. As shown in FIG. 13, the nozzle managing mechanism NM includes the cleaning portion 57a, the suction portion 57b, and the liquid receiving portion 57c. The cleaning portion 57a cleans the front end of the nozzle 52 by dipping it in the solution. The suction portion 57b includes the suction pads 57d which suction the front end of the nozzle 52. The suction pads 57d are connected to a suction pump (not shown) or the like. The liquid receiving portion 57c is a portion which receives the liquid material preliminarily ejected from the nozzle 52.

Figure 14:
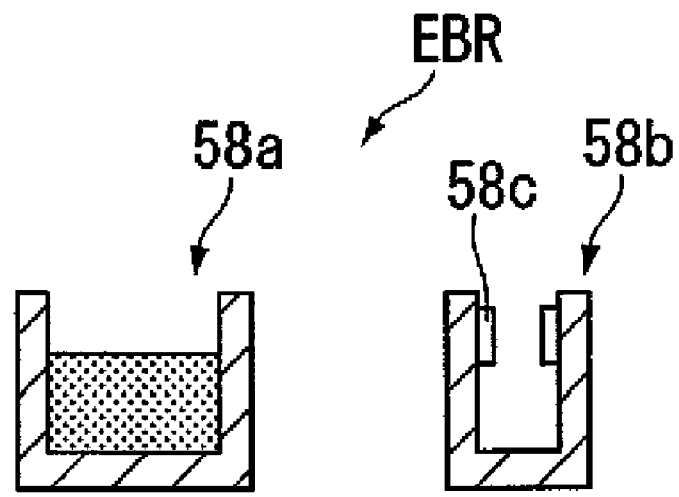
FIG. 14 is a view showing a constitution of a peripheral edge removing mechanism.

The peripheral edge removing mechanism EBR is provided at a position on the +X direction side of the coating mechanism CT along the −Y direction side edge of the substrate processing unit SPU. The peripheral edge removing mechanism EBR is a device which removes the thin film formed on the peripheral edge of the substrate S. It is desirable that a removing process using the peripheral edge removing mechanism EBR be performed in a state where the thin film formed on the substrate S is not completely dry. For this reason, it is desirable that the peripheral edge removing mechanism EBR be disposed at a position capable of carrying the substrate S from the coating mechanism CT. The peripheral edge removing mechanism EBR includes, as shown in FIG. 14, a removing portion 58a and a suction portion 58b. The removing portion 58a is, for example, a portion which removes the thin film formed on the peripheral edge of the substrate S in such a manner that the peripheral edge of the substrate S is dipped in the solution by rotating the substrate S so as to dissolve and remove the thin film formed on the peripheral edge of the substrate S. The removing portion 58a includes suction pads 58c which suction the peripheral edge of the substrate S. The suction pads 58c are connected to a suction pump (not shown) or the like.

Figure 15:
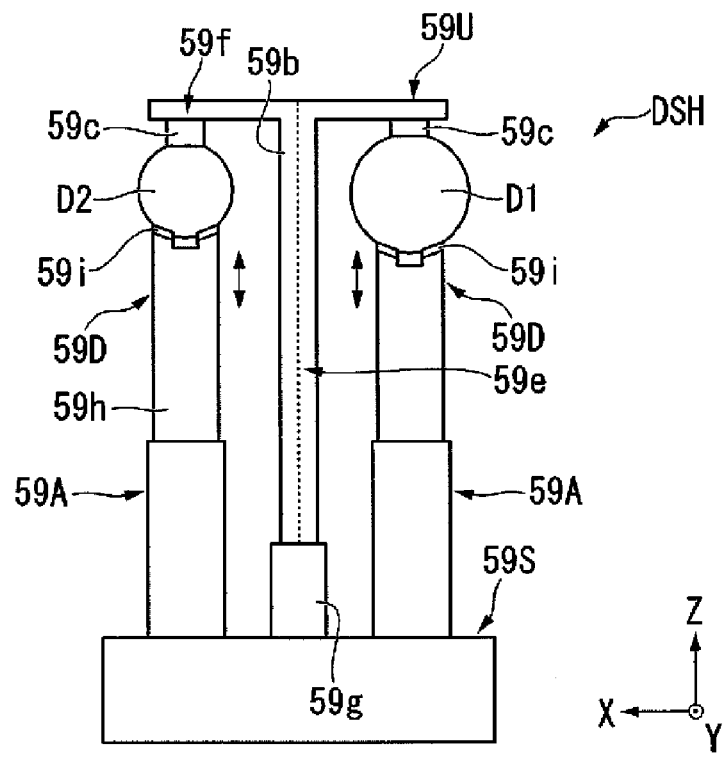
FIG. 15 is a view showing a constitution of a dummy substrate holding mechanism.
Figure 16:
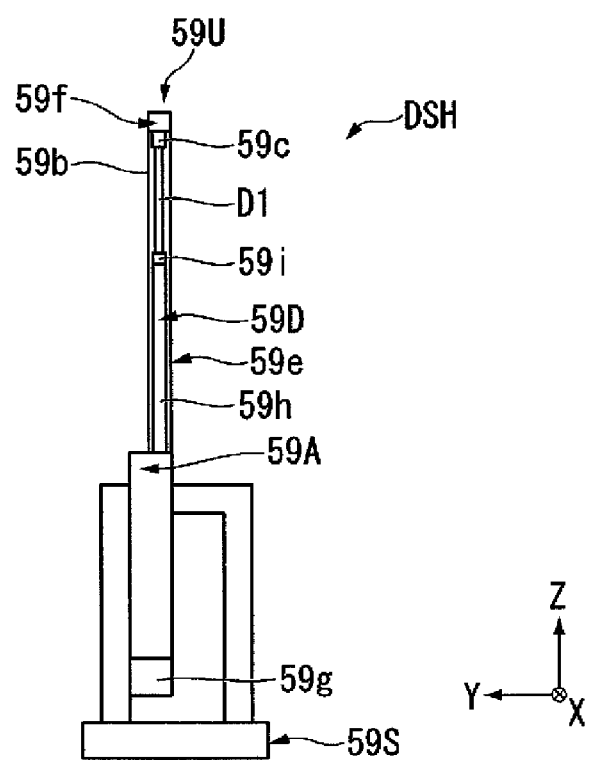
FIG. 16 is a view showing the constitution of the dummy substrate holding mechanism.

Returning to FIG. 1, the dummy substrate holding mechanism DSH is provided at a position on the −X direction side of the coating mechanism CT along the −Y direction side edge of the substrate processing unit SPU. The dummy substrate holding mechanism DSH is disposed at a position so as to interpose the loading carrying mechanism SC1 with the loading position LP for the substrate S, and at a position at which the loading carrying mechanism SC1 is allowed to access it. FIGS. 15 and 16 are views showing a constitution of the dummy substrate holding mechanism DSH. FIG. 15 is a view showing the constitution of the dummy substrate holding mechanism DSH when viewed from the +Y direction side, and FIG. 16 is a view showing the constitution of the dummy substrate holding mechanism DSH when viewed from the −X direction side.

As shown in FIGS. 15 and 16, the dummy substrate holding mechanism DSH holds dummy substrates (D1, D2) used for cleaning the cup portion CP. The dummy substrate holding mechanism DSH holds the dummy substrate D1 and the dummy substrate D2 which are different in size in an upright state. For example, the dummy substrate D1 is formed into a size greater than the dummy substrate D2. The size of one of the dummy substrates D1 and D2 may be the same size as the substrate S, and the both may have sizes different from that of the substrate S. The dummy substrate holding mechanism DSH includes a substrate upper portion holding mechanism 59U, a substrate lower portion holding mechanisms 59D, a supporting mechanism 59S, and a driving mechanisms 59A. The dummy substrate holding mechanism DSH has a constitution in which the substrate upper portion holding mechanism 59U and the driving mechanisms 59A are mounted to the supporting mechanism 59S, and the substrate lower portion holding mechanisms 59D are connected to the driving mechanisms 59A.

The substrate upper portion holding mechanism 59U is a portion holding the +Z direction sides of the dummy substrates D1 and D2, and includes a supporting member 59b and clamping members 59c. The supporting member 59b is mounted to the central portion in the X direction of the supporting mechanism 59S. The supporting member 59b includes a pillar portion 59e and a branching portion 59f. The −Z direction side end of the pillar portion 59e is connected to the supporting mechanism 59S via a connection member 59g. The branching portion 59f is a portion of the pillar portion branched into the +X direction side and the −X direction side at the +Z direction side end of the pillar portion 59e.

The supporting member 59b may be individually provided to each of the dummy substrate D1 and the dummy substrate D2. For example, such a constitution in which the supporting member 59b shown in FIG. 15 is divided by the central portion in the X direction (the portion shown by the broken line in FIG. 15), and the respective portions of the divided supporting member 59b independently hold the dummy substrate D1 and the dummy substrate D2, may be cited. In this case, it is possible to move the respective divided supporting member 59b independently in the Z direction.

The clamping members 59c are respectively mounted to the branching portion 59f branched into the +X direction side and the −X direction side. The clamping members 59c are respectively disposed on the −Z direction sides of the branching portion 59f. The clamping members 59c hold the +Z direction side ends of the dummy substrates D1 and D2 so as to sandwich them.

The respective clamping members 59c are formed so as to differ in holding position along the Z direction according to sizes of the dummy substrates D1 and D2 to be held. In the present embodiment, in FIG. 15, the clamping member 59c on the +X direction side is formed such that a holding position along the Z direction is on the −Z direction side as compared with the clamping member 59c on the −X direction side. In detail, their holding positions are adjusted such that the central positions of the respective dummy substrates D1 and D2 are the same in the Z direction while the dummy substrates D1 and D2 are held. Therefore, during an access by the loading carrying mechanism SC1, there is no need to adjust the positions along the Z direction (adjust the heights) between the dummy substrate D1 and the dummy substrate D2, which makes it possible to avoid troublesome control.

The substrate lower portion holding mechanisms 59D are portions holding the −Z direction sides of the dummy substrates D1 and D2, and include raising and lowering members 59h and clamping members 59i. The raising and lowering members 59h and the clamping members 59i are each provided on the +X direction side and the −X direction side of the above-described pillar portion 59e. The respective raising and lowering members 59h and clamping members 59i are provided so as to respectively correspond to the dummy substrate D1 and the dummy substrate D2.

The respective raising and lowering members 59h are respectively connected to the driving mechanisms 59A. The respective raising and lowering members 59h are formed into longitudinal plate shapes in the Z direction. The respective raising and lowering members 59h are provided so as to be movable in the Z direction by the respective driving mechanisms 59A.

Figure 17:
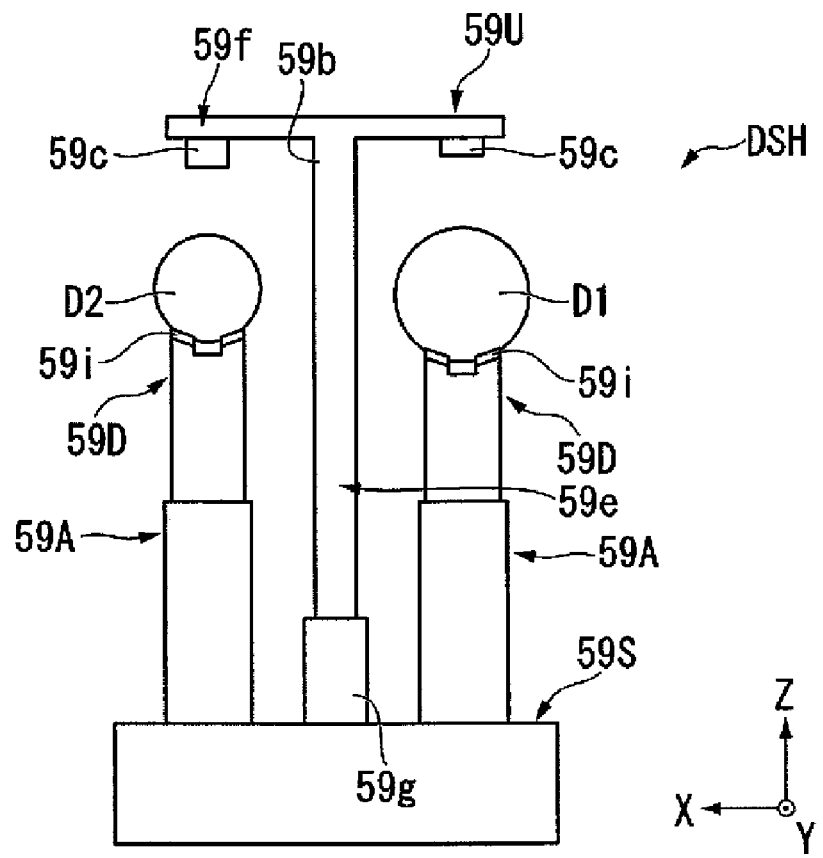
FIG. 17 is a view showing the constitution of the dummy substrate holding mechanism.

The clamping members 59i are provided to the +Z direction side ends of the respective raising and lowering members 59h. The clamping members 59i respectively hold the −Z direction side ends of the dummy substrate D1 and the dummy substrate D2 so as to sandwich them. FIG. 17 is a view showing a mode of the substrate lower portion holding mechanisms 59D. As shown in the drawing, the substrate lower portion holding mechanisms 59D are provided so as to be movable in the Z direction in a state of holding the dummy substrate D1 and the dummy substrate D2.

Substrate Unloading Unit

Returning to FIGS. 1 to 3, the substrate unloading unit ULU is disposed on the +X direction side of the substrate processing unit SPU in the substrate processing system SYS. The substrate unloading unit ULU is a unit which collects the unloading cassette C2 accommodating the processed substrate S and receives the empty unloading cassette C2. The substrate unloading unit ULU is elongated in the Y direction, and is capable of accommodating plural unloading cassettes C2 arranged in the Y direction.

The substrate unloading unit ULU includes a cassette entrance 60 and a cassette moving mechanism (second moving mechanism) 61. The cassette entrance 60 is an opening which is provided on the −Y direction side of the cover member covering the substrate unloading unit ULU. The cassette entrance 60 is an inlet (supply opening) for the empty unloading cassette C2, and an outlet (collection opening) for the unloading cassette C2 accommodating the processed substrate S.

The cassette moving mechanism 61 includes, for example, a driving mechanism such as a belt conveyor mechanism. In the embodiment, as the driving mechanism, conveyor belts are provided. The conveyor belts extend in the Y direction from the +Y direction side end portion of the substrate unloading unit ULU to the −Y direction side end portion thereof, where two conveyor belts are arranged in the X direction.

Among the two conveyor belts, the supply belt 61a is a conveyor belt which is disposed on the −X direction side. The +Z direction side surface of the supply belt 61a is used as a conveyor surface. The supply belt 61a is adapted to rotate so that the conveyor surface moves in the +Y direction. Plural unloading cassettes C2, which enter the substrate unloading unit ULU through the cassette entrance 60, are placed on the conveyor surface of the supply belt 61a. The unloading cassettes C2 are moved to the carrying unit CRU by the rotation of the supply belt 61a.

Among the two conveyor belts, the collection belt 61b is a conveyor belt which is disposed on the +X direction side. The +Z direction side surface of the collection belt 61b is used as a conveyor surface. The collection belt 61b is adapted to rotate so that the conveyor surface moves in the −Y direction. Plural unloading cassettes C2 accommodating the processed substrates S are placed on the conveyor surface of the collection belt 61b. The unloading cassettes C2 are allowed to move to the cassette entrance 60 by the rotation of the collection belt 61b.

Among the two conveyor belts, the collection belt 61b is a conveyor belt which is disposed on the +X direction side. The +Z direction side surface of the collection belt 61b is used as a conveyor surface. The collection belt 61b is adapted to rotate so that the conveyor surface moves in the −Y direction. Plural unloading cassettes C2 accommodating the processed substrates S are placed on the conveyor surface of the collection belt 61b. The unloading cassettes C2 are allowed to move to the cassette entrance 60 by the rotation of the collection belt 61b.

Carrying Unit

The carrying unit CRU is disposed in an area along the +Y direction side edge inside the substrate processing system SYS, and is disposed so as to be adjacent to the substrate processing unit SPU, the substrate loading unit LDU, and the substrate unloading unit ULU. The carrying unit CRU carries the loading cassette C1 between the substrate processing unit SPU and the substrate loading unit LDU, and carries the unloading cassette C2 between the substrate processing unit SPU and the substrate unloading unit ULU. The carrying unit CRU includes a rail mechanism RL and a cassette carrying mechanism CC.

The rail mechanism RL is fixed onto the stage unit STU, and extends in a linear shape in the X direction from the −X-direction-side end portion of the carrying unit CRU to the +X-direction-side end portion thereof. The rail mechanism RL is a guiding mechanism which guides the moving position of the cassette carrying mechanism CC. The rail mechanism RL includes two rail members 70 which are parallel in the Y direction.

The cassette carrying mechanism CC is provided on two rail members 70 so as to be suspended on the two rail members 70 in plan view. The cassette carrying mechanism CC is a carrying mechanism which accesses the buffer mechanism BF of the substrate processing unit SPU, the substrate loading unit LDU, and the substrate unloading unit ULU, and holds and carries the loading cassette C1 and the unloading cassette C2. The cassette carrying mechanism CC includes a movable member 71, a cassette support plate 72, a support plate rotating mechanism 73, a cassette holding member 74, a holding member raising and lowering mechanism 75 (FIG. 3), and a holding member sliding mechanism 76 (FIG. 3).

The movable member 71 is formed in an H-shape in plan view, and includes concave portions 71a which are respectively fitted to two rail members 70. The movable member 71 includes, for example, a driving mechanism (a motor mechanism or the like) which is not shown in the drawing. The movable member 71 is adapted to be movable in a linear area along the rail members 70 by the driving force of the driving mechanism.

The cassette support plate 72 is a plate-shaped member which is fixed to the movable member 71 and is formed in a rectangular shape in plan view. The cassette support plate 72 is formed to have a dimension larger than that of the bottom portion of each of the loading cassette C1 and the unloading cassette C2, and is capable of stably placing the loading cassette C1 and the unloading cassette C2 thereon. Since the cassette support plate 72 is fixed to the movable member 71, the cassette support plate 72 moves together with the movable member 71.

The support plate rotating mechanism 73 is a rotary mechanism which rotates the cassette support plate 72 in the XY plane where the Z axis serves as the rotary axis. The support plate rotating mechanism 73 is capable of changing the longitudinal direction of each of the loading cassette C1 and the unloading cassette C2 placed on the cassette carrying mechanism CC by rotating the cassette support plate 72.

The cassette holding member 74 is a holding member which is disposed on the +Y direction side of the cassette support plate 72 in plan view and is formed in a U-shape in plan view. The cassette holding member 74 is provided so that the X-direction position thereof overlaps with the cassette support plate 72. The cassette holding member 74 is supported on the movable member 71 through a support member (not shown), and is movable together with the movable member 71. Both end portions, formed in a U-shape, of the cassette holding member 74 are formed as a holding portion 74a which engages with the engagement portion Cx provided in each of the loading cassette C1 and the unloading cassette C2. A gap of the holding portion 74a (both end portions formed in a U-shape) in the X direction is adjustable in accordance with a gap of the engagement portion Cx provided in each of the loading cassette C1 and the unloading cassette C2. The cassette holding member 74 is capable of further reliably holding the loading cassette C1 and the unloading cassette C2 in the Z direction in such a manner that the holding portion 74a engages with the engagement portion Cx.

The holding member raising and lowering mechanism 75 is a moving mechanism which is provided in the cassette holding member 74 and moves the cassette holding member 74 in the Z direction. As the holding member raising and lowering mechanism 75, for example, a driving mechanism such as an air cylinder may be used. When the cassette holding member 74 moves in the +Z direction due to the holding member raising and lowering mechanism 75, it is possible to lift the loading cassette C1 and the unloading cassette C2 held by the cassette holding member 74. More specifically, when the cassette holding member 74 moves in the −Z direction due to the holding member raising and lowering mechanism 75, it is possible to place the lifted cassette on a desired position.

The holding member sliding mechanism 76 is a moving mechanism which is provided in the cassette holding member 74, and moves the cassette holding member 74 in the Y direction. The holding member sliding mechanism 76 includes a guide bar 76b which extends in the Y direction and a movable member 76a which moves along the guide bar 76b. The movable member 76a is fixed to the cassette holding member 74. When the movable member 76a moves in the Y direction along the guide bar 76b, the cassette holding member 74 moves together with the movable member 76a in the Y direction.

Control Unit

The control unit CNU is provided in the stage unit STU of the substrate processing system SYS. The control unit CNU includes, for example, a control device which controls all operations in the respective units and a material supply source which supplies a material required for each unit, where all operations include a substrate processing operation in the substrate processing unit SPU, a cassette moving operation in the substrate loading unit LDU or the substrate unloading unit ULU, a carrying operation in the carrying unit CRU, and the like. The material supply source may be exemplified by, for example, a liquid material supply source, a cleaning liquid supply source, or the like.

Next, an operation of the substrate processing system SYS having the above-described constitution will be described. The operations performed by the respective units of the substrate processing system SYS are controlled by the control unit CNU. In the below description, the unit performing the operation is mainly described, but actually, the operation is performed on the basis of the control of the control unit CNU.

Cassette Supply Operation

First, the cassette supply operation in which the loading cassette C1 accommodating the unprocessed substrate S is disposed in the substrate loading unit LDU, and the empty unloading cassette C2 is disposed in the substrate unloading unit ULU will be described.

For example, by a supply device (not shown) or the like, the loading cassette C1 accommodating the unprocessed substrate S is supplied to the substrate loading unit LDU through the cassette entrance 10. The substrate loading unit LDU allows the loading cassettes C1 to sequentially supply while rotating the supply belt 11a. By this operation, plural loading cassettes C1 accommodating the unprocessed substrates S are arranged inside the substrate loading unit LDU.

On the other hand, for example, by a supply device (not shown) or the like, the empty unloading cassette C2 is supplied to the substrate unloading unit ULU through the cassette entrance 60. The substrate unloading unit ULU allows the unloading cassettes C2 to sequentially supply while rotating the supply belt 61a. By this operation, plural unloading cassettes C2 accommodating the unprocessed substrates S are arranged inside the substrate unloading unit ULU.

Cassette Carrying Operation

Next, the cassette carrying operation in which the loading cassette C1 supplied to the substrate loading unit LDU and the unloading cassette C2 supplied to the substrate unloading unit ULU are respectively supplied to the substrate processing unit SPU will be described. This cassette carrying operation is performed by using the cassette carrying mechanism CC provided in the carrying unit CRU.

The operation of carrying the loading cassette C1 will be described. The carrying unit CRU allows the cassette carrying mechanism CC to access the substrate loading unit LDU, and transfers the loading cassettes C1 and moves the cassette carrying mechanism CC up to the loading buffer mechanism BF1. The carrying unit CRU moves the cassette carrying mechanism CC, and places the loading cassettes C1 to the standby position P1 of the loading buffer mechanism BF1. After the transfer operation, the substrate loading unit LDU moves the supply belt 11a, and moves the rest of the loading cassettes C1 together in the +Y direction. According to the movement of the loading cassettes C1, the space on the −Y direction side on the supply belt 11a becomes empty. Accordingly, a new loading cassette C1 is supplied to the empty space by a supply mechanism (not shown).

The operation of carrying the unloading cassette C2 is performed in the same manner. That is, the carrying unit CRU allows the cassette carrying mechanism CC to access the substrate unloading unit ULU, and transfers the unloading cassettes C2 and moves the cassette carrying mechanism CC up to the unloading buffer mechanism BF1. The carrying unit CRU moves the cassette carrying mechanism CC, and places the unloading cassettes C2 to the standby position P5 of the unloading buffer mechanism BF2. After the transfer operation, the substrate unloading unit ULU moves the supply belt 61a, and moves the rest of the unloading cassettes C2 together in the +Y direction. According to the movement of the unloading cassettes C2, the space on the −Y direction side on the supply belt 61a becomes empty. Accordingly, a new unloading cassette C2 is supplied to the empty space by a supply mechanism (not shown).

Substrate Processing Operation

Next, a processing operation of the substrate processing unit SPU will be described.

The substrate processing unit SPU performs a moving operation of moving the loading cassette C1 accommodating the unprocessed substrate S and the empty unloading cassette C2, a loading operation of loading the substrate S accommodated in the loading cassette C1, a coating operation of coating a liquid material on the substrate S, a peripheral edge removing operation of removing the peripheral edge of the thin film formed on the substrate S, an unloading operation of unloading the processed substrate S, a moving operation of moving the empty loading cassette C1 and the unloading cassette C2 accommodating the processed substrate S, a maintenance operation of a nozzle portion NZ, and a maintenance operation of a cup portion CP, respectively. In addition to the respective operations, the carrying operation of carrying the substrate S is performed between the loading operation and the coating operation, between the coating operation and the peripheral edge removing operation, and between the shape forming operation and the unloading operation.

Among these operations, first, the moving operation of the loading cassette C1 and the unloading cassette C2 will be described. The substrate processing unit SPU moves the loading cassette C1 carried to the standby position P1 of the loading buffer mechanism BF1 to the standby position P2 by using the conveyor belt 20a, and further moves the loading cassette C1 moved to the standby position P2 to the standby position P4 by using the conveyor belt 20b. In the same manner, the substrate processing unit SPU moves the unloading cassette C2 carried to the standby position P5 of the unloading buffer mechanism BF2 to the standby position P6 by using the conveyor belt 22a, and further moves the unloading cassette C2 moved to the standby position P6 to the standby position P8 by using the conveyor belt 22b. According to these operations, the loading cassette C1 and the unloading cassette C2 carried to the substrate processing unit SPU are disposed at a process start position.

Next, the loading operation of the substrate S will be described. After the substrate processing unit SPU checks that the loading cassette C1 is disposed at the standby position P4, the substrate processing unit SPU disposes the substrate upper portion holding mechanism 23 at the clamping position and moves the raising and lowering member 24a of the substrate lower portion holding mechanism 24 in the +Z direction. According to the movement, the clamping member 24b mounted to the +Z direction side end portion of the raising and lowering member 24a comes into contact with the −Z direction side portion of one sheet of substrate S disposed on the farthest −Y direction side among the substrate S accommodated in the loading cassette C1, and the −Z direction side portion of the substrate S is held by the clamping member 24b.

After the −Z direction side portion of the substrate S is held, the substrate processing unit SPU further moves the raising and lowering member 24a in the +Z direction in the held state of the substrate S. According to the movement, the substrate S is lifted in the +Z direction side by the substrate lower portion holding mechanism 24, the +Z direction side portion of the substrate S comes into contact with the clamping member 23b of the substrate upper portion holding mechanism 23, and then the +Z direction side portion of the substrate S is held by the clamping member 23b. The substrate S is held by both the clamping member 23b of the substrate upper portion holding portion 23 and the clamping member 24b of the substrate lower portion holding mechanism 24.

The substrate processing unit SPU simultaneously moves the raising and lowering members 23a and 24a in the +Z direction in the state where the substrate S is held by the clamping members 23b and 24b. The substrate processing unit SPU moves the raising and lowering mechanisms 23c and 24c in an interlocking manner so that the raising and lowering members 23a and 24a move at the same speed. The substrate S held by the clamping members 23b and 24b moves in the +Z direction. When the substrate S is disposed at the loading position LP, the substrate processing unit SPU stops the movement of the raising and lowering members 23a and 24a. In this manner, the loading operation of the substrate S is performed.

After the loading operation, the substrate processing unit SPU allows the holding portion 32 of the loading carrying mechanism SC1 to access the loading position LP, and allows the substrate S disposed at the loading position LP to be held by the holding portion 32. When the holding portion 32 accesses the loading position LP, the substrate processing unit SPU rotates the rotary table 30b so that the front end surface 31b of the arm portion 31 faces the +Y direction, and drives the motor device 35a so that the arm portion 31 moves in the Y direction. In accordance with the movement of the arm portion 31, the holding portion 32 mounted to the front end surface 31b of the arm portion 31 accesses the loading position LP.

After the access of the holding portion 32, the substrate processing unit SPU operates the suction pump 34a and the substrate S is held by suction of the holding portion 32. By means of the operation, the substrate S is held by the holding portion 32 so as to be upright in the Z direction. In the substrate processing unit SPU, after the substrate S is uprightly held by the holding portion 32, the holding force of the clamping members 23b and 24b is canceled so that the substrate S is held by only the holding portion 32. In this state, the substrate processing unit SPU withdraws the clamping members 23b and 24b, of which the holding force is canceled, in the −Z direction. After the clamping members 23b and 24b are withdrawn, the substrate processing unit SPU rotates the rotary table 30b of the loading carrying mechanism SC1, and carries the substrate S, which is held upright in the Z direction, to a coating position inside the coating mechanism CT.

Next, the coating operation of coating the liquid material on the substrate S will be described. In the coating operation, the coating mechanism CT is used. The substrate processing unit SPU rotates the substrate S at a high speed while the substrate is upright in the Z direction, allows nozzles 52 provided in the coating mechanism CT to access a coating position 50, and then ejects the liquid material from the nozzles 52 to the substrate S.

In detail, the substrate processing unit SPU operates the motor device 33a in the state where the substrate S is disposed at the coating position 50. When the rotary shaft member 33b rotates by the operation of the motor device 33a, the holding portion 32 supported to the rotary shaft member 33b rotates together with the rotary shaft member 33b. According to this operation, the substrate S rotates while the substrate S is upright in the Z direction.

After the substrate S rotates in the state where the substrate S is upright in the Z direction, the substrate processing unit SPU allows the nozzle 52 on the +X and −X direction sides of the coating position 50 to access the substrate S, and ejects the liquid material from the nozzle 52 to the front and rear surfaces of the substrate S. The ejected liquid material equally spreads to the outer periphery of the substrate S by the centrifugal force caused by the rotation, thereby forming a thin film on both surfaces of the substrate S.

Since the nozzles 52 are disposed on the −Z direction side of the rotary axis of the substrate S, the nozzles 52 are disposed without contacting with the holding portion 32 and the arm portion 31. In addition, since the nozzles 52 eject the liquid material from the rotary axis of the substrate S to the outer periphery of the substrate S, the movement of the liquid material toward the center of the substrate S is suppressed.

The substrate processing unit SPU may have a constitution in which an inner cup CP1 is rotated upon coating the liquid material on the substrate S by rotating the substrate S. In the case where the substrate processing unit SPU is configured to rotate the inner cup CP1, as shown in FIG. 9, the inner cup CP1 is provided with a rotary mechanism (second rotary mechanism) 53c which rotates the inner cup CP1 about the X axis serving as the rotary axis in a direction along the outer periphery of the substrate S. Further, the discharging mechanism 54 is connected the outer cup CP2, and the inner cup CP1 is provided with a discharge hole. Regardless of the rotation of the inner cup CP1, in the liquid material ejected onto the substrate S, due to the rotation of the substrate S, the liquid material protrudes and flows from the substrate S, and is accommodated in an accommodation portion 53 through an opening formed in a facing portion 53a of the inner cup CP1. In the inside of the accommodation portion 53, due to the rotation of the substrate S, the stream of the liquid material and gas occurs in the rotation direction. In accordance with the stream, the liquid material and gas are discharged to a discharge path through a discharging mechanism 54 connected to an outer cup CP2. The liquid material and gas discharged to the discharge path are divided by a trap mechanism 55, so that the gas passes through the trap mechanism 55 and the liquid material remains in the trap mechanism 55. The liquid material remaining in the trap mechanism 55 is discharged through a discharge portion (not shown).

After the coating operation, the substrate processing unit SPU makes the holding portion 42 of the unloading carrying mechanism SC2 access the substrate S inside the coating mechanism CT from the +X direction, and the holding portion 42 holds the substrate S. The operation of holding the substrate S using the holding portion 42 is the same as that of the case where the substrate S is held by the holding portion 32. According to this operation, one surface of the substrate S is held by the holding portion 32 of the loading carrying mechanism SC1 and the other surface of the substrate S is held by the holding portion 42 of the unloading carrying mechanism SC2.

After the substrate S is held by the holding portion 42, the substrate processing unit SPU stops the operation of the suction pump 34a so as to cancel the holding operation using the holding portion 32. According to this operation, since the substrate S is held by only the holding portion 42 of the unloading carrying mechanism SC2, the substrate S is delivered from the loading carrying mechanism SC1 to the unloading carrying mechanism SC2.

Next, the peripheral edge removing operation of removing the thin film formed in the periphery of the substrate S will be described. In the peripheral edge removing operation, the peripheral edge removing mechanism EBR is used. The peripheral edge of the substrate S disposed inside the peripheral edge removing mechanism EBR is dipped in the solution by rotating the substrate S so as to dissolve and remove the thin film formed on the peripheral edge of the substrate S dipped in the solution. In the present embodiment, upon rotating the substrate S in a peripheral edge removing operation, the substrate S is rotated by using the unloading carrying mechanism SC2 in a state in which the substrate S is held by the unloading carrying mechanism SC2. After removing the thin film on the peripheral edge, the substrate processing unit SPU moves the peripheral edge of the substrate S to the space between the suction pads 58c (FIG. 14) of the suction portion 58b (FIG. 14), to suction the peripheral edge of the substrate S. According to the suctioning operation, it is possible to remove the liquid material and the solution remaining on the peripheral edge of the substrate S.

In more detail, after the delivery operation of the substrate S, the substrate processing unit SPU rotates a rotary table 40b and appropriately expands or contracts an arm portion 41 so that the holding portion 42 accesses the peripheral edge removing mechanism EBR. After the access, the substrate processing unit SPU moves the arm portion 41 or the dip portion, so that the peripheral edge of the substrate S is dipped in the solution of the dip portion. In this state, the substrate processing unit SPU operates a motor device 43a of the unloading carrying mechanism SC2. The rotary shaft member 43b rotates by an action of the motor device 43a, and the suction member 46 held by the rotary shaft member 43b rotates together with the rotary shaft member 43b. The thin film of the peripheral edge of the substrate S is removed by the rotation.

After the peripheral edge removing operation, the substrate processing unit SPU moves the raising and lowering member 25a so that the clamping member 25b of the substrate upper portion holding mechanism 25 is located on the +Z direction side of the unloading position UP. After the movement of the raising and lowering member 25a, the substrate processing unit SPU rotates the rotary table 40b in the state where the substrate S is held by the holding portion 42 of the unloading carrying mechanism SC2, and appropriately expands or contracts the arm portion 41 so that the holding portion 42 accesses the unloading position UP. According to this operation, the substrate S is disposed at the unloading position UP.

Next, the unloading operation of the substrate S will be described. After the substrate processing unit SPU checks that the substrate S is disposed at the unloading position UP, the substrate processing unit SPU moves the raising and lowering member 25a of the substrate upper portion holding mechanism 25 in the −Z direction and the raising and lowering member 26a of the substrate lower portion holding mechanism 26 in the +Z direction. According to this movement, the clamping member 25b mounted to the −Z direction side portion of the raising and lowering member 25a comes into contact with the +Z direction side portion of the substrate S, and the clamping member 26b mounted to the +Z direction side end portion of the raising and lowering member 26a comes into contact with the −Z direction side portion of the substrate S so that the +Z direction side portion and the −Z direction side portion of the substrate S are respectively held by the clamping members 25b and 26b.

After the substrate processing unit SPU checks that the substrate S is held by both the clamping members 25b and 26b, the substrate processing unit SPU stops the operation of the suction pump 44a of the unloading carrying mechanism SC2 so as to cancel the operation of holding the substrate S using the holding portion 42. According to this operation, the substrate S is held by only the clamping members 25b and 26b. The substrate processing unit SPU simultaneously moves the raising and lowering members 25a and 26a in the −Z direction in the state where the substrate S is held by the clamping members 25b and 26b. The substrate processing unit SPU moves the raising and lowering mechanisms 25c and 26c in an interlocking manner so that the raising and lowering members 25a and 26a move at the same speed. The substrate S is moved in the −Z direction in the state where the substrate S is held by the clamping members 25b and 26b.

When the protrusion of the raising and lowering member 25a approaches the unloading cassette C2, the substrate processing unit SPU cancels the holding force using the clamping member 25b and stops the movement of the raising and lowering member 25a so that only the raising and lowering member 26a moves in the −Z direction. The substrate S is moved in the −Z direction in the state where the substrate S is held by the holding force using the clamping member 26b.

The substrate processing unit SPU maintains the operation of holding the substrate S using the clamping member 26b until the substrate S arrives at the accommodation position inside the unloading cassette C2. After the substrate S arrives at the accommodation position, the substrate processing unit SPU cancels the holding operation using the clamping member 26b, and moves the raising and lowering member 26a in the −Z direction. According to this operation, the substrate S is accommodated in the unloading cassette C2.

In the description of the respective operations, the respective operations are sequentially performed on one sheet of substrate S accommodated on the farthest −Y direction side of the loading cassette C1, but actually, the respective operations are continuously performed on a plurality of substrates S. In this case, the substrate processing unit SPU rotates the conveyor belt 20b and moves the loading cassette C1 in the −Y direction so that the substrate S disposed on the farthest −Y direction side of the rest of the substrates S accommodated in the loading cassette C1 is disposed at a position overlapping with the loading position LP in plan view.

In the same manner, the substrate processing unit SPU rotates the conveyor belt 22b and moves the unloading cassette C2 in the −Y direction so that the accommodation position on the farthest −Y direction side of the accommodation positions inside the unloading cassette C2 is disposed at a position overlapping with the unloading position UP in plan view. When the substrate processing unit SPU moves the loading cassette C1 and the unloading cassette C2, the substrate processing unit SPU repeats the above-described operations.

In the case where plural substrates S are processed, the substrate processing unit SPU simultaneously performs the processing operations on the plural substrates S. In detail, during the time when the coating operation is performed on a certain substrate S, the peripheral edge removing operation is performed on the other substrate S. In addition, the loading operation or the unloading operation is performed on another substrate S. In this manner, the operations are simultaneously performed on the plural substrates S. Thus, since the process operations are simultaneously performed, the standby time of the substrate S is reduced as much as possible, and hence the process takt time of the substrate S is reduced.

In the case where the processes of all the substrates S accommodated in the loading cassette C1 end, the loading cassette C1 is empty, and all accommodation positions of the unloading cassette C2 staying at the standby position P8 are filled with the processed substrates S. After the substrate processing unit SPU checks this state, the substrate processing unit SPU moves the loading cassette C1 from the standby position P4 to the standby position P2 by rotating the conveyor belt 20b in the inverse direction, and moves the loading cassette C1 to the standby position P3 by rotating the conveyor belt 20a. In the same manner, the substrate processing unit SPU moves the unloading cassette C2 from the standby position P8 to the standby position P6 by rotating the conveyor belt 22b in the inverse direction, and moves the unloading cassette C2 to the standby position P7 by rotating the conveyor belt 22a.

Next, a maintenance operation of a nozzle portion NZ and a cup portion CP of the coating mechanism CT will be described. When the coating operation is repeated, solidified materials such as a liquid material or impurities such as chips or dust in the atmosphere may be adhered to the nozzle portion NZ or the cup portion CP. The impurities may block, for example, the nozzles 52 to thereby deteriorate the ejecting characteristic thereof or may block the discharge path inside the cup portion CP. In addition, in the ejecting operation, it is necessary to constantly manage the ejecting condition of the nozzles 52. Accordingly, it is necessary to periodically perform the maintenance operation of the nozzle portion NZ and the cup portion CP.

In the maintenance operation of the nozzle portion NZ, a nozzle managing mechanism NM is used. Upon cleaning the nozzles 52, the substrate processing unit SPU moves the nozzle portion NZ so that the nozzle managing mechanism NM accesses the nozzles 52. The substrate processing unit SPU cleans the front end of each nozzle 52 by moving the front end of the nozzles 52 in the cleaning liquid of a cleaning portion 57a.

After the cleaning operation, the substrate processing unit SPU moves the front end of the nozzle 52 to a gap between the suction pads 57d of the suction portion 57b, and suctions the front end of the nozzle 52. According to the suctioning operation, impurities such as the cleaning liquid remaining in the nozzle 52 are removed.

After the suctioning operation, the substrate processing unit SPU moves the front end of the nozzle 52 to the inside of a liquid receiving portion 57c. In the liquid receiving portion 57c, a preliminary ejecting operation of the nozzle 52 is performed. By preliminarily discharging the liquid material from the nozzle 52, the ejecting condition of the nozzle 52 is adjusted. After the substrate processing unit SPU moves the front end of the nozzle 52 to the inside of the liquid receiving portion 57c, the substrate processing unit SPU ejects the liquid material from the nozzle 52. The ejected liquid material is collected in the liquid receiving portion 57c, and is collected by a collecting mechanism (not shown).

Next, the maintenance operation of the cup portion CP will be described. Upon cleaning the cup portion CP, the dummy substrate D1 or the dummy substrate D2 is used. The substrate processing unit SPU allows the loading carrying mechanism SC1 to access the dummy substrate holding mechanism DSH.

In the case where the substrate processing unit SPU allows the loading carrying mechanism SC1 to access the dummy substrate holding mechanism DSH, the substrate processing unit SPU rotates the rotary table 30b of the loading carrying mechanism SC1 in a direction opposite to the case of rotating the rotary table 30b to the loading position LP (in a clockwise direction in plan view) from a state in which the loading carrying mechanism SC1 accesses the coating position 50.

After the loading carrying mechanism SC1 is allowed to access the dummy substrate holding mechanism DSH, the substrate processing unit SPU selects one dummy substrate of the two dummy substrates D1 and D2 held by the dummy substrate holding mechanism DSH, to allow the holding portion 32 to access the dummy substrate. Hereinafter, for example, a case in which the dummy substrate D1 is selected will be described.

At the time of delivering the dummy substrate D1, first, the substrate processing unit SPU makes the dummy substrate D1 held by the clamping member 59c and the clamping member 59i be suctioned by the holding portion 32. After the suction, the substrate processing unit SPU cancels the holding force of the clamping member 59c and the clamping member 59i of the dummy substrate holding mechanism DSH, and moves the substrate upper portion holding mechanism 59U in the +Z direction side, and moves the substrate lower portion holding mechanisms 59D in the −Z direction side. By this operation, the dummy substrate D1 held by the dummy substrate holding mechanism DSH is delivered to the loading carrying mechanism SC1.

After the substrate processing unit SPU makes the loading carrying mechanism SC1 hold the dummy substrate D1, the substrate processing unit SPU makes the loading carrying mechanism SC1 carry the dummy substrate D1 to the coating position 50. After the dummy substrate D1 is disposed at the coating position 50, the substrate processing unit SPU rotates the holding portion 32 of the loading carrying mechanism SC1. By this operation, the dummy substrate D1 carried to the coating position 50 is rotated.

The substrate processing unit SPU allows the cleaning liquid nozzle portions 56 to access the +X-direction-side portion and the −X-direction-side portion of the dummy substrate D1 while the dummy substrate D1 rotates, and ejects the cleaning liquid from the respective cleaning liquid nozzle portions 56 to the dummy substrate D1. The cleaning liquid ejected onto the dummy substrate D1 moves to the peripheral edge of the dummy substrate D1 by the centrifugal force caused by the rotation, and is splashed from the peripheral edge of the dummy substrate D1 to the inner cup CP1 side. The splashed cleaning liquid is accommodated in the accommodation portion 53 through the opening of the facing portion 53a.

In this way, at the time of ejecting the cleaning liquid from the cleaning liquid nozzle portions 56, the substrate processing unit SPU rotates the dummy substrate D1 regardless of the rotation of the inner cup CP1. By this operation, it is possible to form a stream of the cleaning liquid inside the accommodation portion 53, that cleans the inside of the accommodation portion 53 and the inside of the discharge path by the stream of the cleaning liquid. As in the case of discharging the liquid material, the cleaning liquid that have cleaned the inside of the accommodation portion 53 is divided by the trap mechanism 55 and discharged separately from a gas.

The cleaning operation of the cup portion CP may be performed, for example, in the state where the facing portion 53a of the accommodation portion 53 is separated. Even in the case where the cleaning operation is not performed, for example, the facing portion 53a may be separated so as to separately clean the facing portion 53a, or the facing portion 53a may be separated so as to perform the maintenance operation of other portions of the cup portion CP.

At the time of completing the cleaning operation, the substrate processing unit SPU stops the operation of the cleaning liquid nozzles 56, and stops the rotary operation of the rotary portion 32 of the loading carrying mechanism SC1. After stopping the rotary operation of the dummy substrate D1, the substrate processing unit SPU makes the loading carrying mechanism SC1 move the dummy substrate D1 to the dummy substrate holding mechanism DSH.

After moving the dummy substrate D1, the substrate processing unit SPU allows the substrate upper portion holding mechanism 59U to move to the −Z direction side to make the clamping member 59c hold the +Z direction side end of the dummy substrate D1, and allows the substrate lower portion holding mechanisms 59D to move to the +Z direction side to make the clamping member 59i hold the −Z direction side end of the dummy substrate D1.

After making the clamping member 59c and the clamping member 59i hold the dummy substrate D1, the substrate processing unit SPU cancels the absorption force by the holding portion 32 of the loading carrying mechanism SC1. By this operation, delivery of the dummy substrate D1 from the loading carrying mechanism SC1 to the dummy substrate holding mechanism DSH is carried out. As described above, a cleaning operation of the cup portion CP is performed by using the dummy substrate D1.

In the case where the holding portion 32 of the loading carrying mechanism SC1 is made to select and hold the dummy substrate D2 in the cleaning operation of the cup portion CP described above, the substrate processing unit SPU performs the same operations. Since the dummy substrate D2 is formed to be smaller in size as compared with the dummy substrate D1, this may correspond to, for example, the case in which a substrate smaller than the substrate S is processed. In addition, by replacing the facing portion 53a of the accommodation portion 53, it is possible to process a substrate different in size from the substrate S.

Cassette Carrying Operation

Next, the cassette carrying operation in which the empty loading cassette C1 is carried to the substrate loading unit LDU and the unloading cassette C2 accommodating the processed substrate S is carried to the substrate unloading unit ULU will be described.

The operation of carrying the loading cassette C1 will be described. The carrying operation is performed using the cassette carrying mechanism CC used in the above-described carrying operation. The carrying unit CRU moves the cassette carrying mechanism CC up to the loading buffer mechanism BF1 of the substrate processing unit SPU, and allows the cassette carrying mechanism CC to perform the transfer operation of the empty loading cassette C1 staying in a standby state at the standby position P3.

After the transfer operation of the loading cassette C1, the carrying unit CRU moves the cassette carrying mechanism CC in the −X direction toward the substrate loading unit LDU. After the movement, the carrying unit CRU places the empty loading cassette C1 placed on the cassette support plate 72 on the +Y direction side end portion of the collection belt 11b, and withdraws the cassette holding member 74 in the +Y direction.

The operation of carrying the unloading cassette C2 will be described. The carrying operation is performed using the cassette carrying mechanism CC in the same manner as in the operation of carrying the loading cassette C1. The carrying unit CRU moves the cassette carrying mechanism CC up to the unloading buffer mechanism BF2 of the substrate processing unit SPU in the X direction, and allows the cassette carrying mechanism CC to perform the transfer operation of the empty unloading cassette C2 which stays in the standby position P7.

After the transfer operation, the carrying unit CRU moves the cassette carrying mechanism CC in the +X direction toward the substrate unloading unit ULU. After the movement, the carrying unit CRU places the empty unloading cassette C2 placed on the cassette support plate 72 on the +Y direction side end portion of the collection belt 61*b*, and withdraws the cassette holding member 74 in the +Y direction.

Cassette Collecting Operation

Next, a cassette collecting operation of collecting the empty loading cassette C1 and the unloading cassette C2 accommodating the processed substrate S will be described.

After the substrate loading unit LDU checks that the empty loading cassette C1 is carried thereto, the substrate loading unit LDU rotates the collecting belt 11*b* so that the loading cassette C1 is carried to the outside of the substrate loading unit LDU through the cassette entrance 10. Whenever the loading cassette C1 is carried to the substrate loading unit LDU, this operation is repeated.

In the same manner, after the substrate unloading unit ULU checks that the unloading cassette C2 accommodating the processed substrate S is carried thereto, the substrate unloading unit ULU rotates the collecting belt 61*b*, so that the unloading cassette C2 is moved in the −Y direction and carried to the outside of the substrate unloading unit ULU through the cassette entrance 60. Whenever the unloading cassette C2 is carried to the substrate unloading unit ULU, this operation is repeated.

Cassette Supplement Operation

After the carrying unit CRU checks that the standby positions P1 and P5 are empty, the carrying unit CRU allows the cassette carrying mechanism CC to carry the next loading cassette C1 and the unloading cassette C2 to the standby positions P1 and P5, respectively. The carrying unit CRU first moves the cassette carrying mechanism CC up to the substrate loading unit LDU, and transfers the next loading cassette C1 thereto. After the transfer operation, the carrying unit CRU moves the cassette carrying mechanism CC up to the loading buffer mechanism BF1, and places the transferred loading cassette C1 to the standby position P1. In the same manner, the carrying unit CRU moves the cassette carrying mechanism CC to the substrate unloading unit ULU, and transfers the next unloading cassette C2 thereto. Then, the carrying unit CRU moves the cassette carrying mechanism CC to the unloading buffer mechanism BF2, and places the unloading cassette C2 to the standby position P5.

When the loading cassette C1 moves from the standby position P1 to the standby position P2, and the unloading cassette C2 moves from the standby position P5 to the standby position P6, the standby positions P1 and P5 become empty again. The next loading caste C1 and the next unloading cassette C2 may stay at the empty standby positions P1 and P5, respectively. Thus, whenever the standby positions P1 and P5 of the loading buffer mechanism BF1 and the unloading buffer mechanism BF2 are empty, the carrying unit CRU carries the loading cassette C1 from the substrate loading unit LDU and carries the unloading cassette C2 from the substrate unloading unit ULU.

As described above, according to the present embodiment, since the substrate processing unit SPU is provided with the dummy substrate holding mechanism DSH holding the dummy substrates D1 and D2 at holding positions which are different from the loading position LP, the coating position 50, and the unloading position UP, and at which the substrate carrying mechanism SC can be connected thereto, it is possible to carry the dummy substrates D1 and D2 to the coating position 50 by using the substrate carrying mechanism SC. Accordingly, it is possible to efficiently dispose the dummy substrates D1 and D2 to the coating position 50 while suppressing a lowering of throughput.

Further, according to the present embodiment, since the holding positions of the dummy substrates D1 and D2 by the dummy substrate holding mechanism DSH are disposed at altitudinal positions which are the same as the loading position LP, the coating position 50, and the unloading position UP, the control of an altitudinal position of the substrate carrying mechanism SC can be set in common with them. Accordingly, it is possible to avoid the complexity of the operation of the substrate carrying mechanism SC.

Further, according to the present embodiment, since the plurality of holding positions for the dummy substrates are set, it is possible to carry a dummy substrate held at an optimum holding position among the plurality of holding positions according to a position of the substrate carrying mechanism SC and a coating situation of the substrate S. Accordingly, it is possible to improve the efficiency of the process. In addition, in the present embodiment, since the dummy substrates D1 and D2 which are respectively different in size are held at the plurality of holding positions, it is possible to select a dummy substrate of an optimum size according to a position or an extent of stain inside the cup portion CP, and carry the dummy substrate to the coating position CT.

Further, according to the present embodiment, since the holding position is disposed at a position so as to interpose the substrate carrying mechanism SC with the loading position LP, the holding position is disposed at a position easy to be accessed by the substrate carrying mechanism SC. Accordingly, it is possible to more rapidly carry the dummy substrate D1 or D2 to the coating position.

According to the present embodiment, since the dummy substrate holding mechanism DSH includes the dummy substrate raising and lowering members 59*h* and the driving mechanisms 59A which raise and lower the dummy substrates D1 and D2, it is possible to easily carry out replacement and installation of the dummy substrates D1 and D2. Accordingly, it is possible to perform settings for the dummy substrates D1 and D2 more rapidly by a simple operation.

According to the present embodiment, since the substrate processing unit SPU further includes the cleaning nozzles 56 which clean the cup portion CP using the dummy substrates D1 and D2, it is possible to clean the cup portion CP by an operation which is the same as the operation of coating a coating liquid onto the substrate S. Accordingly, it is possible to supply the cleaning liquid to the inside of the cup portion CP through a route similar to a splashing route of the coating liquid splashing inside the cup portion CP, which makes it possible to efficiently clean the coating liquid.

The technical scope of the invention is not limited to the above-described embodiment, but may be appropriately modified into various forms without departing from the spirit of the invention.

For example, in addition to the constitution of the above-described embodiment, the substrate processing unit SPU may have a constitution in which the dummy substrate holding mechanism DSH includes a managing portion (not shown) which manages the states of the dummy substrates D1 and D2. As such a managing portion, for example, a cleaning mechanism for the dummy substrates D1 and D2, a drying mechanism for the dummy substrates D1 and D2, or the like may be used. Such a managing portion may be provided to, for example, the dummy substrate holding mechanism DSH, or may be provided outside the dummy substrate holding mechanism DSH. Accordingly, it is possible to maintain the states of the dummy substrates D1 and D2 in an optimum state.

Further, in the above-described embodiment, the substrate processing unit SPU has the constitution in which the cleaning liquid nozzles 56 are disposed as nozzles for ejecting a cleaning liquid for cleaning the cup portion CP, but the invention is not limited thereto. For example, the above-described nozzles 52 may be used as cleaning liquid nozzles as well. In this case, a switching mechanism (not shown) which is capable of switching the supplying source of the nozzle 52 depending on a liquid material and a cleaning liquid, is provided. Accordingly, it is possible to efficiently carry out maintenance without complicating the constitution of the device.

Further, in the above-described embodiment, the nozzle portion NZ is disposed at the position on the −Z direction side of the rotary axis of the substrate S, and the nozzle portion NZ is configured to eject the liquid material along the direction of gravitational force, but the invention is not limited thereto. For example, the nozzle portion NZ may be disposed at a position on the +Z direction side of the rotary axis of the substrate S, and the nozzle portion NZ may be configured to eject the liquid material against the direction of gravitational force.

Further, in the above-described embodiment, the nozzle 52 and the cleaning nozzle 56 are formed by bending, but the invention is not limited thereto. For example, the nozzle 52 and the cleaning nozzle 56 may be formed in a curved form toward the −Z direction side of the rotary axis of the substrate S. Accordingly, it is possible to smoothen the circulation of the liquid material.

Further, in the above-described embodiment, the nozzles 52 are disposed at the same positions of the front surface and the rear surface of the substrate S, but the invention is not limited thereto. For example, the nozzles 52 may be disposed at different positions as a position of the front surface and a position of the rear surface. For example, relative to the +X direction side of the coating position 50, the nozzle 52 may be disposed on the −Z direction side of the rotary axis of the substrate S, and relative to the −X direction side of the coating position 50, the nozzle 52 may be disposed on the +Z direction side of the rotary axis of the substrate S. The positions on the +Z direction side and the −Z direction side may, of course, be reversed.

Further, in the above-described embodiment, the nozzle managing mechanisms NM are respectively disposed at the positions on the +Y direction side of the respective nozzle portions NZ, but the invention is not limited thereto. The nozzle managing mechanism NM may be disposed at another position within a range in which the nozzle managing mechanism NM is able to move.

Figure 18:
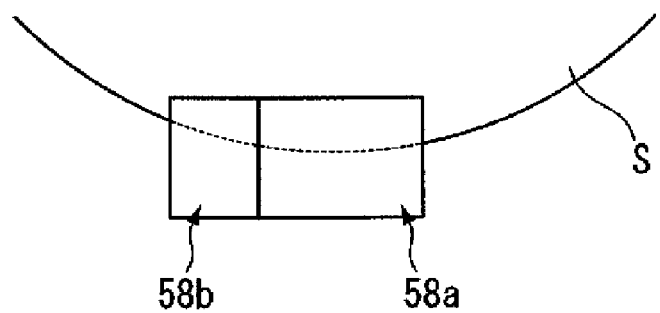
FIG. 18 is a view showing another constitution of the peripheral edge removing mechanism.

Further, in the above-described embodiment, in the constitution of the peripheral edge removing mechanism EBR, the removing portion 58a and the suction portion 58b are disposed in a direction vertical to the substrate surface of the substrate S, but the present invention is not limited thereto. For example, as shown in FIG. 18, the peripheral edge removing mechanism EBR may have a constitution in which the removing portion 58a and the suction portion 58b are disposed so as to be adjacent to each other on the substrate surface. In this constitution, it is possible to substantially dispose the peripheral edge of one substrate S in the removing portion 58a and the suction portion 58b. Accordingly, it is possible to remove and suction the peripheral edge by rotating the substrate S, which makes it possible to shorten a process takt time.

Further, in the above-described embodiment, the substrate carrying mechanisms SC are provided at the two positions in the substrate processing unit SPU, but the invention is not limited thereto. For example, the substrate carrying mechanism SC may be disposed at one position, or the substrate carrying mechanisms SC may be disposed at three or more positions.

Further, in the above-described embodiment, the description of the constitution in which the substrate loading unit LDU includes the belt conveyor mechanism as the moving mechanism 11 has been made as an example, but the invention is not limited thereto. The substrate loading unit LDU may include a fork member that holds the engagement portion Cx of the loading cassette C1 other than the belt conveyor mechanism. This fork member may be formed in the same way as, for example, the cassette holding member 74 of the cassette carrying device CC. The fork member may be configured to hold the engagement portion Cx of the loading cassette C1 to move in the substrate loading unit LDU. The fork member may be used as the cassette moving mechanism 61 of the substrate unloading unit ULU.

Further, in the above-described embodiment, the description of the conveyor belts 20a, 20b, 22a, and 22b as mechanisms for moving the standby positions of the loading cassette C1 and the unloading cassette C2 in the loading buffer mechanism BF1 and the unloading buffer mechanism BF2, has been made as an example, but the present invention is not limited thereto. For example, the loading buffer mechanism BF1 may be provided with a moving mechanism for moving the loading cassette C1 to the standby position P1, the standby position P2, the standby position P4, the standby position P2, and the standby position P3 in series. In the same way, the unloading buffer mechanism BF2 may be provided with a moving mechanism for moving the unloading cassette C2 to the standby position P5, the standby position P6, the standby position P8, the standby position P6, and the standby position P7 in series. As such moving mechanisms, for example, a constitution with fork members holding the engagement portions Cx of the loading cassette C1 and the unloading cassette C2, may be exemplified. This fork member may be formed in the same way as, for example, the cassette holding member 74 of the cassette carrying device CC.

Further, in the above-described embodiment, the loading carrying mechanism SC1 independently holds the substrate S to rotate the substrate S, but the present invention is not limited thereto. For example, the loading carrying mechanism SC1 and the unloading carrying mechanism SC2 may be configured to sandwich the front surface and the rear surface of the substrate S to rotate the substrate S. In this case, one of the loading carrying mechanism SC1 and the unloading carrying mechanism SC2 may be self-driven to rotate, and the other one of the loading carrying mechanism SC1 and the unloading carrying mechanism SC2 may be driven to rotate, or both of them may be self-driven to rotate. When the front surface and the rear surface of the substrate S are held by the loading carrying mechanism SC1 and the unloading carrying mechanism SC2, it is possible to equalize the states of air current and the like on the front surface side and the rear surface side of the substrate S as much as possible. When the states on the both surface sides of the substrate S are adjusted, it is possible to prevent the qualities of the films coated on the both surfaces of the substrate S from differing from each other.

Further, in the above-described embodiment, the peripheral edge removing mechanism EBR is provided only on the side of the unloading carrying mechanism SC2, but the present invention is not limited thereto. For example, the peripheral edge removing mechanism EBR may be provided on the side of the loading carrying mechanism SC1 as well (the portion of the dashed line in FIG. 1). With this constitution, for example, it is possible to cause both of the loading carrying mechanism SC1 and the unloading carrying mechanism SC2 to perform a coating operation and a peripheral edge removing operation respectively.

For example, while the loading carrying mechanism SC1 is caused to perform a coating operation, it is possible to cause the unloading carrying mechanism SC2 to perform a peripheral edge removing operation. Reversely, while the loading carrying mechanism SC1 is caused to perform a peripheral edge removing operation, it is possible to cause the unloading carrying mechanism SC2 to perform a coating operation. In such a manner, since the two substrate loading devices SC are alternately made to access the coating device CT, which makes it possible to perform parallel processes, efficient processing is possible, which makes it possible to make an attempt to further shorten the process takt time.

Further, as described above, when the loading carrying mechanism SC1 and the unloading carrying mechanism SC2 are configured to simultaneously hold the substrate S to rotate the substrate S, the inside of the peripheral edge removing mechanism EBR may be provided in the coating device CT. With this constitution, the coating operation is performed in the state where the substrate S is held and rotated by each of the loading carrying device SC1 and the unloading carrying device SC2, and the peripheral edge removing operation is continuously performed after the coating operation. Accordingly, since the coating operation and the peripheral edge removing operation are performed by one device, it is possible to improve the efficiency of the process. In addition, since the coating operation and the peripheral edge removing operation are performed by one coating device CT, for example, after performing the coating operation and the peripheral edge removing operation on one sheet of substrate S, the next substrate S to be processed can be loaded by the loading carrying device SC1 in the state where the one sheet of substrate S is unloaded by the unloading carrying device SC2. Since it is possible to simultaneously perform the loading operation using the loading carrying device SC1 and the unloading operation using the unloading carrying device SC2, it is possible to efficiently perform the process operation.

In the case where the peripheral edge removing device EBR is disposed inside the coating device CT, for example, a peripheral edge removing nozzle 56 having the same shape as that of the nozzle used for coating the liquid material may be separately disposed inside the coating device CT, and the solution of the liquid material may be ejected from the peripheral edge removing nozzle. In addition, the solution nozzle may be commonly used with the cleaning liquid nozzle portion 56. In this case, the supply source of the solution is connected to the cleaning liquid nozzle portion 56, and one of the supply sources of the cleaning liquid and the solution is selected to eject the cleaning liquid or the solution, thereby ejecting both the cleaning liquid and the solution from the same cleaning liquid nozzle portion 56.

Figure 19A:
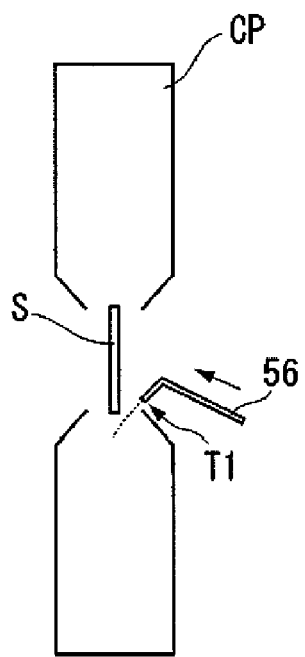
FIGS. 19A and 19B are views showing another constitution of the coating mechanism according to the present invention.
Figure 19B:
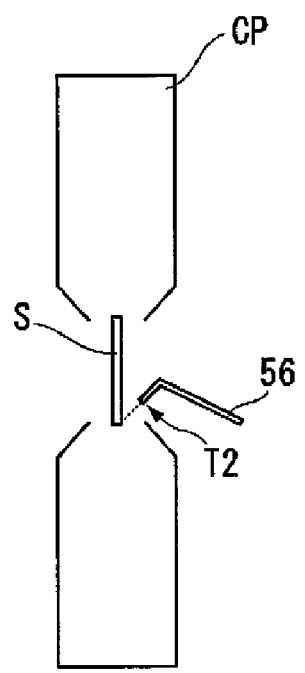

In the case where the solution is ejected from the cleaning liquid nozzle portion 56, for example, as shown in FIG. 19A, the control unit CNU ejects the solution from the cleaning liquid nozzle portion 56 at a position T1 where the solution does not contact with the substrate S. Subsequently, as shown in FIG. 19B, the control unit CNU moves the cleaning liquid nozzle portion 56 to a position T2 where the solution is ejected to the substrate S, and ejects the solution to the peripheral edge of the substrate S at the ejecting position T2. According to these operations, it is possible to prevent the solution flowing from the cleaning liquid nozzle portion 56 from flying to the center of the substrate S, and thus to improve the precision of adjusting the coating state of the outer periphery of the substrate S.

In the above-described embodiment, the cassette moving mechanisms 20, 22 are described as the belt conveyor mechanism in the loading buffer mechanism BF1 and the unloading buffer mechanism BF2, but the present invention is not limited thereto. For example, as shown in FIG. 20, the cassette C may be carried by the arm mechanism.

Figure 20:
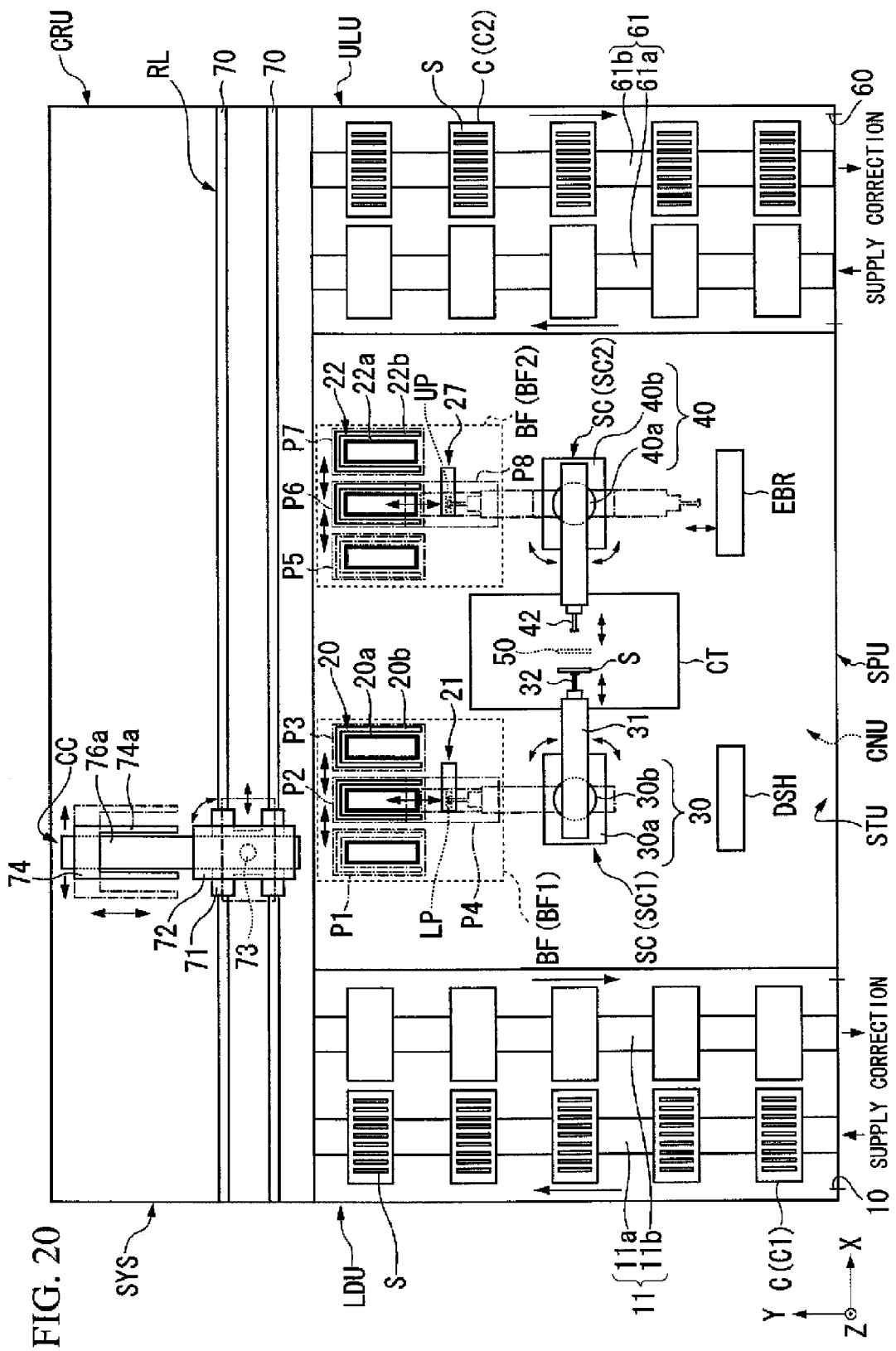
FIG. 20 is a view showing another constitution of a cassette moving mechanism.
Figure 21:
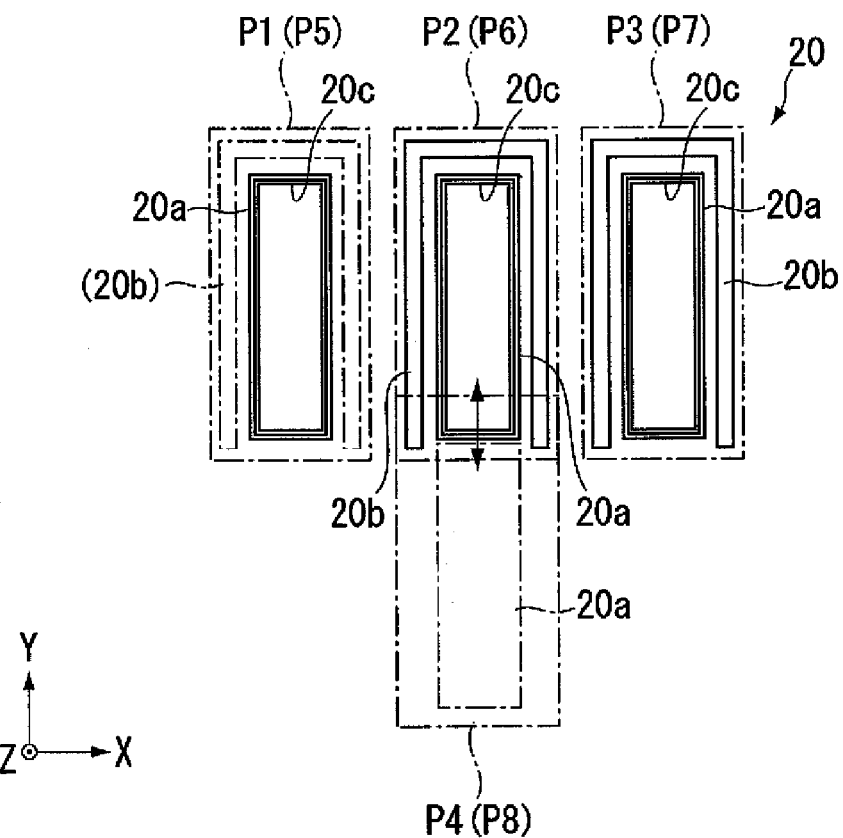
FIG. 21 is a view showing another constitution of the cassette moving mechanism.
Figure 22:
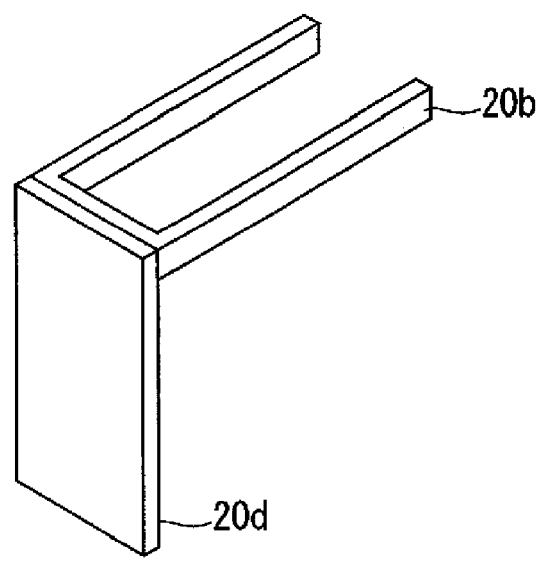
FIG. 22 is a view showing a partial constitution of the cassette moving mechanism.
Figure 23:
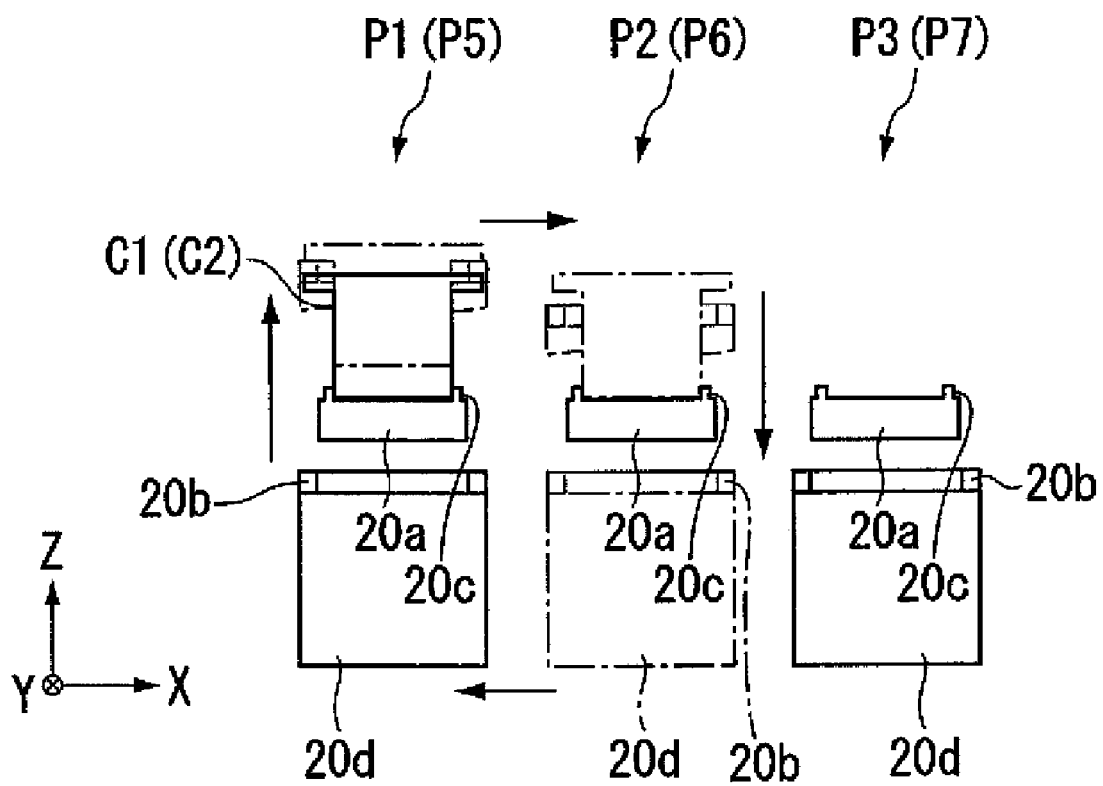
FIG. 23 is a view showing another constitution of the cassette moving mechanism.

FIG. 20 is a view which corresponds to FIG. 1 in the above-described embodiment and shows a constitution of cassette moving mechanisms 20, 22. FIG. 21 is an enlarged view of the cassette moving mechanism 20 of FIG. 20. FIG. 22 is a view showing a partial constitution of the cassette moving mechanism 20. FIG. 23 is a view showing the state when the cassette moving mechanism 20 is viewed in the +Y direction. Since the cassette moving mechanism 20 has the same constitution as that of the cassette moving mechanism 22, the description is mainly made by way of the cassette moving mechanism 20. FIGS. 21 and 23 show the standby positions P1 to P4 corresponding to the standby position P5 to P8.

As shown in FIGS. 20 to 23, the cassette moving mechanism 20 includes a cassette placing member 20a and a cassette carrying arm 20b. The cassette placing member 20a is a plate-shaped member provided respectively at the standby positions P1 to P3. On the +Z side surface of the cassette placing member 20a, a loading cassette C1 is placed.

As shown in FIGS. 20 and 21, the cassette placing member 20a provided at the standby position P2 is movable in the Y direction by the driving portion (not shown). Therefore, the cassette placing member 20a provided at the standby position P2 is removable between the standby position P2 and the standby position P4 by the driving portion. The cassette placing member 20a provided at the standby positions P1 and P3 is in the fixed state.

As shown in FIGS. 21 and 23, on the +Z side surface (placing surface) of the cassette placing member 20a, the ring-shaped convex portion 20c is formed along the outer periphery of the loading cassette C1. By providing this convex portion 20c, the loading cassette C1 is fitted into the convex portion 20c in the state where the loading cassette C1 is placed on the cassette placing member 20a. Therefore, it becomes possible to perform positioning of the loading cassette C1 and to prevent the positional deviation of the loading cassette C1.

The cassette carrying arm 20b is provided at two positions of the standby positions P1 to P3. The cassette carrying arm 20b is formed along the outer periphery of the cassette placing member 20a in the Z direction view. The cassette carrying arm 20b is provided movably in the X and Z directions by the driving portion (not shown). As shown in FIG. 22, the cassette carrying arm 20b is in the state of being fixed to and supported by the arm supporting member 20d. To the arm supporting member 20d, the driving mechanism (not shown) is connected. The driving mechanism (not shown) forms the arm supporting member 20d movably in the X and Z directions. The cassette carrying arm 20b is movable together with the movement of the arm supporting member 20d. As shown in FIG. 23, the cassette carrying arm 20b is provided movably on the +Z side and the −Z side of the cassette placing member 20a.

Next, an operation of the cassette moving mechanism 20 with the above-described constitution will be described. While the operation is mainly described by way of the cassette moving mechanism 20 in the following description of the operation, the similar operation is performed with respect to the cassette moving mechanism 22.

The substrate processing unit SPU moves the cassette carrying arm 20b from the −Z side to the +Z side of the cassette placing member 20a in the state where the loading cassette C1 is placed on the cassette placing member 20a provided at the standby position P1 using the driving mechanism (not shown) mounted to the arm supporting member 20d. By this operation, the cassette carrying arm 20b receives the loading cassette C1, resulting in a state where the loading cassette C1 is lifted from the cassette placing member 20a.

The substrate processing unit SPU moves the cassette carrying arm 20b lifting the loading cassette C1 in the +X direction, and then stops the movement at the standby position P2. After stopping the movement, the substrate processing unit SPU moves the cassette carrying arm 20b in −the Z direction of the cassette placing member 20a. By this operation, the cassette carrying arm 20b delivers the loading cassette C1 to cassette placing member 20a, and also the cassette carrying arm 20b moves to the −Z side of the cassette placing member 20a. The loading cassette C1 is placed on the cassette placing member 20a in a state where the bottom portion is fitted into the convex portion 20c.

The substrate processing unit SPU moves the cassette carrying arm 20b to the −Z side of the cassette placing member 20a, and then moves the cassette carrying arm 20b in the −X direction. By this operation, the cassette carrying arm 20b returns to the original position (standby position P1). Simultaneously, the substrate processing unit SPU moves the cassette carrying arm 20b disposed at the standby position P3 in −the X direction. By this operation, the cassette carrying arm 20b is placed on the −Z side of the cassette placing member 20a of the standby position P2.

The substrate processing unit SPU performs an operation of moving the cassette placing member 20a to the standby position P4 from the state where the loading cassette C1 is placed on the cassette placing member 20a at the standby position P2. By the operation, the loading cassette C1 moves from the standby position P2 to the standby position P4. In this case, the substrate processing unit SPU has a constitution in which the cassette carrying arm 20b disposed at the standby position P2 does not move, and only the cassette placing member 20a moves to the standby position P4. After delivering the substrate S at the standby position P4, the substrate processing unit SPU moves the cassette placing member 20a from the standby position P4 to the standby position P2. By this operation, the loading cassette C1 is returned to the standby position P2.

The substrate processing unit SPU moves the cassette carrying arm 20b disposed newly at the standby position P2 on the +X side in the drawing in the +Z direction. By this operation, the loading cassette C1 is held and lifted by the cassette carrying arm 20b. The substrate processing unit SPU lifts the loading cassette C1, moves the cassette carrying arm 20b in the +X direction, and then stops the movement at the standby position P3. After stopping the movement, the substrate processing unit SPU moves the cassette carrying arm 20b in the −Z direction, and places the loading cassette C1 on the cassette placing member 20a of the standby position P3. The loading cassette C1 is placed on cassette placing member 20a in the state where the bottom portion is fitted into the convex portion 20c in the same manner as in the carrying operation from the standby position P1 to the standby position P2.

As described above, the substrate processing unit SPU moves the cassette carrying arm 20b disposed on the −X side in the drawing between the standby position P1 and the standby position P2, and moves the cassette carrying arm 20b disposed on the +X side in the drawing between the standby position P2 and the standby position P3. By this operation, it is possible to separately carry the loading cassette C1 disposed at the standby position P1 and the loading cassette C1 disposed at the standby position P2.

The substrate processing unit SPU moves the cassette placing member 20a disposed at the standby position P2 between the standby position P2 and the standby position P4. By this operation, it is possible to move the loading cassette C1 carried to the standby position P2 to the standby position P4, and to return the loading cassette C1 at the standby position P4 to the standby position P2.

Further, in the present embodiment, the substrate processing unit SPU has the constitution in which the dummy substrate D1 (D2) is sandwiched respectively by the clamping members 59c and the clamping members 59i, but the invention is not limited thereto. For example, the substrate processing unit SPU may have a constitution in which the substrate upper portion holding mechanism 59U and the substrate lower portion holding mechanism 59D sandwich the dummy substrate D1 (D2) from above and below.

Further, in the present embodiment, the description has been made by using the example that the dummy substrate D1 and the dummy substrate D2 are used for cleaning the cup portion CP, but the invention is not limited thereto. For example, the dummy substrate D1 and the dummy substrate D2 may be used for a case where a coating operation is performed on a trial basis, such as a case where a test ejection for condition setting is performed in the coating mechanism CT. In this case, for example, there is an advantage that it is possible to perform a test ejection for condition setting with respect to the dummy substrate D1 and the dummy substrate D2 which are different in size.

What is claimed is:

1. A substrate processing system comprising:
   a coating mechanism which includes coating nozzles for forming a layer onto front and rear surfaces of a substrate while rotating the substrate which is disposed vertically at a predetermined coating position;
   a carrying mechanism which carries the substrate between a substrate loading position, the coating position, and a substrate unloading position; and
   a dummy substrate holding mechanism which holds a dummy substrate at a holding position which is a position different from the substrate loading position, the coating position, and the substrate unloading position, and at which the carrying mechanism is allowed to connect with the dummy substrate.

2. The substrate processing system according to claim 1, wherein
   the holding position is disposed at an altitudinal position which is the same as at least one of the substrate loading position, the coating position, and the substrate unloading position.

3. The substrate processing system according to claim 1, wherein
   a plurality of the holding positions are set.

4. The substrate processing system according to claim 3, wherein
   dummy substrates respectively different in size are held at the plurality of holding positions.

5. The substrate processing system according to claim 1, wherein
   the dummy substrate holding mechanism includes a managing portion which manages a state of the dummy substrate.

6. The substrate processing system according to claim 1, wherein
   the holding position is disposed at a position so as to interpose the carrying mechanism with the substrate loading position or the substrate unloading position.

7. The substrate processing system according to claim 1, wherein
   the dummy substrate holding mechanism includes a dummy substrate raising and lowering mechanism which raises and lowers the dummy substrate.

8. The substrate processing system according to claim 1, further comprising
   a cleaning mechanism which cleans the coating mechanism by using the dummy substrate.

9. The substrate processing system according to claim 8, wherein
   the cleaning mechanism includes cleaning nozzles for ejecting a cleaning liquid onto the dummy substrate.

10. The substrate processing system according to claim 8, wherein
    the coating mechanism includes a cup portion in which the substrate is accommodated, and
    the cleaning mechanism cleans the cup portion.

* * * * *